(12) United States Patent
Kodama et al.

(10) Patent No.: US 7,966,718 B2
(45) Date of Patent: Jun. 28, 2011

(54) SUBSTRATE-RELATED-OPERATION PERFORMING APPARATUS AND SUBSTRATE-RELATED-OPERATION PERFORMING SYSTEM

(75) Inventors: Seigo Kodama, Ama-gun (JP); Shinsuke Suhara, Kariya (JP)

(73) Assignee: Fuji Machine MFG Co., Ltd., Chiryu (JP)

( * ) Notice: Subject to any disclaimer, the term of this patent is extended or adjusted under 35 U.S.C. 154(b) by 1071 days.

(21) Appl. No.: 10/535,895

(22) PCT Filed: Nov. 19, 2003

(86) PCT No.: PCT/JP03/14757
§ 371 (c)(1),
(2), (4) Date: May 23, 2005

(87) PCT Pub. No.: WO2004/047512
PCT Pub. Date: Jun. 3, 2004

(65) Prior Publication Data
US 2006/0085973 A1  Apr. 27, 2006

(30) Foreign Application Priority Data

Nov. 21, 2002 (JP) ................................. 2002-337739
May 6, 2003 (JP) ................................. 2003-128348

(51) Int. Cl.
*B23P 19/00* (2006.01)
*B23P 23/00* (2006.01)
*B23Q 41/00* (2006.01)

(52) U.S. Cl. ................. 29/739; 29/740; 29/741; 29/564

(58) Field of Classification Search .............. 29/739–41, 29/564, 564.1
See application file for complete search history.

(56) References Cited

U.S. PATENT DOCUMENTS 2,576,643 A * 11/1951 Roerig .......................... 411/435
(Continued)

FOREIGN PATENT DOCUMENTS

CN  1128934 A  8/1996
(Continued)

OTHER PUBLICATIONS

Chinese Patent Office Communication issued Sep. 18, 2009 in Chinese Application No. 200810083723.7.
(Continued)

*Primary Examiner* — A. Dexter Tugbang
*Assistant Examiner* — David P Angwin
(74) *Attorney, Agent, or Firm* — Oliff & Berridge, PLC

(57) ABSTRACT

A component mounting system and apparatus are provided that include a component mounting apparatus with a substrate holding device, a component supplying device, a head support portion, a mounting head and a forcing means. The mounting head is detachably attached to the head support portion. The mounting head of the system has a recording medium in which information relating to the mounting head is recorded. The system has an external storage portion that stores a plurality of batches of information relating to a plurality of mounting heads. The system further includes a recognizing portion that obtains and recognizes information from the external storage corresponding to the mounting head that is attached to the support portion.

28 Claims, 18 Drawing Sheets

U.S. PATENT DOCUMENTS

| | | | | |
|---|---|---|---|---|
| 2,713,882 | A * | 7/1955 | Wilkes | 411/203 |
| 4,831,721 | A * | 5/1989 | Hirai et al. | 29/740 |
| 5,657,534 | A | 8/1997 | Yi | |
| 5,694,219 | A | 12/1997 | Kim | |
| 5,711,065 | A * | 1/1998 | Asai et al. | 29/740 |
| 5,741,114 | A * | 4/1998 | Onodera | 414/783 |
| 5,768,765 | A | 6/1998 | Fujioka et al. | |
| 5,960,534 | A * | 10/1999 | Yazawa et al. | 29/743 |
| 6,526,651 | B1 | 3/2003 | Hwang | |
| 6,918,176 | B2 * | 7/2005 | Nagao et al. | 29/832 |
| 6,968,610 | B2 * | 11/2005 | Nagao et al. | 29/740 |
| 6,973,713 | B1 * | 12/2005 | Huber et al. | 29/740 |
| 7,020,956 | B2 * | 4/2006 | Kuribayashi et al. | 29/832 |
| 7,096,572 | B2 * | 8/2006 | Aigner et al. | 29/740 |
| 2002/0029468 | A1 * | 3/2002 | Koike et al. | 29/832 |
| 2002/0035781 | A1 * | 3/2002 | Kyoutani | 29/740 |
| 2002/0073536 | A1 * | 6/2002 | Okuda et al. | 29/740 |
| 2003/0093896 | A1 * | 5/2003 | Usui et al. | 29/743 |
| 2003/0135991 | A1 * | 7/2003 | Nagao et al. | 29/739 |

FOREIGN PATENT DOCUMENTS

| | | |
|---|---|---|
| CN | 1140390 A | 1/1997 |
| CN | 1153451 A | 7/1997 |
| CN | 1285710 A | 2/2001 |
| JP | A 63-16700 | 1/1988 |
| JP | A 6-104596 | 4/1994 |
| JP | A 2002-314293 | 10/2002 |
| JP | A 2002-353694 | 12/2002 |
| JP | A 2003-218589 | 7/2003 |

OTHER PUBLICATIONS

Apr. 1, 2010 Office Action issued in Chinese Patent Application No. 200810083723.7 (with English translation).

Nov. 5, 2010 Office Action issued in Chinese Patent Application No. 200810083723.7 (with English translation).

* cited by examiner

SUBSTRATE-RELATED-OPERATION PERFORMING APPARATUS AND SUBSTRATE-RELATED-OPERATION PERFORMING SYSTEM

TECHNICAL FIELD

The present invention relates to a substrate-related-operation performing apparatus that performs an operation related to a circuit substrate that is combined with a circuit component to provide an electronic circuit, and particularly to a substrate-related-operation performing apparatus including an operation performing head that performs an operation.

BACKGROUND ART

A substrate-related-operation performing apparatus is an apparatus that performs an operation related to a circuit substrate constituting an electronic circuit, and there are known various sorts of substrate-related-operation performing apparatuses, such as a solder printing apparatus, an adhesive applying apparatus, a component mounting apparatus, or an inspecting apparatus that inspects results of a performed operation. As a sort of substrate-related-operation performing apparatus, there is known an apparatus of a type that includes, as a main element thereof to perform an operation, an operation performing head that is moved relative to a circuit substrate so as to perform the operation. Each of the above-indicated adhesive applying apparatus, the component mounting apparatus, and the inspecting apparatus is an example of the apparatus of that type. In particular, the component mounting apparatus includes, as the operation performing head thereof a mounting head that employs, as a component holding tool thereof, a suction nozzle that takes a component from a component supplying device and mounts the component on a surface of a circuit substrate. Concerning the operation performing head, for example, Japanese Patent Application Publication No. 6-104596 discloses the art of judging, when an arbitrary one of a plurality of suction nozzles is selected and attached to an operation performing head, whether the selected and attached suction nozzle is an appropriate one.

DISCLOSURE OF THE INVENTION

As disclosed by the above-indicated patent document, it is widely practiced to prepare a plurality of elements, such as a plurality of suction nozzles, each of which can be detachably attached as a constituent element of an operation performing head, that is, which can be replaced with each other on the operation performing head. For example, in the case where a plurality of suction nozzles which can be replaced with each other are prepared, it is possible to attach detachably an appropriate one of the suction nozzles, depending upon a sort of a circuit substrate and/or a sort of circuit components to be mounted on the circuit substrate. In this case, all the suction nozzles can be advantageously subjected to maintenance. In addition, since various sorts of suction nozzles can be detachably attached, a substrate-related-operation performing apparatus can find its applications in a wider scope. However, there has conventionally been proposed no technique of using a plurality of operation performing heads that can each be detachably attached, i.e., can be replaced with each other.

It is therefore an object of the present invention to achieve at least one of various advantages, such as a high usability or a wide applicability, that are required for a substrate-related-operation performing apparatus. This object may be achieved according to any of the following modes of the present invention in the form of a substrate-related-operation performing apparatus, an operation performing head for use with a substrate-related-operation performing apparatus, a substrate-related-operation performing system, and an operation-performing-head-use preparing program, each of which is numbered like the appended claims and may depend from the other mode or modes, where appropriate, to indicate and clarify possible combinations of technical features. It is, however, to be understood that the present invention is not limited to the technical features or any combinations thereof that will be described below for illustrative purposes only. It is to be further understood that a plurality of features included in any one of the following modes of the invention are not necessarily provided altogether, and that the invention may be embodied without at least one of the features described with respect to each of the modes.

(1) A substrate-related-operation performing apparatus, characterized by comprising an operation performing head which is detachably attached to the apparatus, and operating, in a state in which the operation performing head is attached to the apparatus, the operation performing head, and thereby performing an operation related to a circuit substrate.

The substrate-related-operation performing apparatus in accordance with the present invention includes an operation performing head, and is characterized in that the operation performing head is detachably attached to the apparatus. The substrate-related-operation performing apparatus is not limited to any particular sorts so long as it includes an operation performing head. For example, the present invention is applicable to various sorts of substrate-related-operation performing apparatuses, such as a component mounting apparatus including a mounting head; an adhesive applying apparatus including an applying head; or an inspection performing apparatus including an inspecting head. Here, the operation performing head is defined as a constituent element of the substrate-related-operation performing apparatus that performs a main portion of an operation performed by the apparatus; for example, an element that is moved relative to a circuit substrate. The substrate-related-operation performing apparatus may additionally include a moving device that moves the operation performing head relative to the circuit substrate. In this case, the operation performing head in accordance with the present invention may be defined as a head that is detachably attached to the moving device. According to the present invention, the operation performing head per se is detachably attached to the apparatus, and this feature is distinguished from a conventional technique wherein a constituent element of an operation performing head is detachably attached to the head. The phrase "detachably attached" means that the operation performing head can be easily attached and detached to and from the apparatus, for example, without using a tool. In short, that phrase means that the head can be attached or detached at one touch. Since the operation performing head can be detachably attached, the usability of the substrate-related-operation performing apparatus can be improved, because, e.g., the apparatus can be easily subjected to maintenance.

(2) The substrate-related-operation performing apparatus according to the mode (1), further comprising a substrate holding device which fixes and holds the circuit substrate; and a component supplying device which supplies a plurality of circuit components, wherein the operation performing head comprises a mounting head which holds each of the circuit components supplied by the component supplying device, takes said each circuit component from the component supplying device, and mounts said each circuit component on a surface of the circuit substrate fixed and held by the substrate holding device, and accordingly the substrate-related-operation performing apparatus functions as a component mounting apparatus.

According to this mode, the substrate-related-operation performing apparatus functions as a component mounting apparatus. Generally, the component mounting apparatus includes a component holding device such as a suction nozzle, and optionally includes an elevating and lowering device that elevates and lowers the component holding device, and a rotating device that rotates the component holding device about an axis line thereof. The substrate-related-operation performing apparatus in accordance with the present invention is particularly advantageous for the case where a mounting head including the component holding device, the elevating and lowering device, and the rotating device is detachably attached. The mounting head including those devices is a precise element. Therefore, if the mounting head can be detachably attached to the apparatus, the head can often be checked for its maintenance. In many cases, the component mounting apparatus includes an X-Y-robot-type head moving device that moves the operation performing head along a plane. In the case where the present invention is applied to the component mounting apparatus, the operation performing head is detachably attached to the head moving device.

(3) The substrate-related-operation performing apparatus according to the mode (1) or (2), wherein an arbitrarily selected one of a plurality of operation performing heads is attachable, as said operation performing head, to the apparatus.

A mode in which a current operation performing head can be replaced with another operation performing head is readable on the present mode. For example, when one operation performing head is subjected to maintenance, another operation performing head can be attached to the apparatus so as to perform an operation. This contributes to improving not only the usability of the apparatus but also an operation efficiency of the same. The present mode encompasses not only a mode in which a plurality of operation performing heads having an identical construction can be replaced with each other, but also a mode in which a plurality of operation performing heads having respective different constructions can be replaced with each other.

(4) The substrate-related-operation performing apparatus according to the mode (3), wherein the operation performing heads have respective different constructions, and an arbitrarily selected one of the operation performing heads having the respective different constructions is attachable, as said operation performing head, to the apparatus.

According to the present mode, a plurality of operation performing heads having different constructions can be replaced with each other. For example, two operation performing heads that perform different sorts of operations can be replaced with each other. The operation performing heads that perform the different sorts of operations may include a mounting head that performs a component mounting operation; an applying head that performs an adhesive applying operation; and an inspecting head that performs an inspecting operation. In the case where operation performing heads having different constructions to such an extent that those heads can perform different sorts of operations can be replaced with each other, the substrate-related-operation performing apparatus can enjoy a high versatility with respect to operations to be performed, and accordingly can enjoy a largely improved applicability. However, the present mode encompasses a mode in which a plurality of operation performing heads having different constructions to perform a same sort of operation can be replaced with each other. As the mounting head as an example of the operation performing head, there are known various sorts of mounting heads that have different constructions depending upon their applications, e.g., mounting heads that employ different numbers of component holding devices, such as suction nozzles; mounting heads that employ different devices that elevate and lower one or more component holding devices; mounting heads that mount circuit components of different shapes or sizes; mounting heads that mount circuit components at different speeds, etc. That is, there are known mounting heads that employ different numbers of constituent elements; mounting heads that employ constituent elements having different shapes; mounting heads that employ constituent elements that do different movements; or mounting heads that employ constituent elements having different functions. According to the present mode, operation performing heads having different constructions to perform a same sort of operation can be replaced with each other, and accordingly the same sort of operation can be performed in various manners. In this respect, the scope of applicability of the substrate-related-operation performing apparatus can be improved.

(5) The substrate-related-operation performing apparatus according to any of the modes (1) through (4), wherein said operation performing head comprises an individual-information recording medium in which individual information related to the operation performing head is recorded, and wherein the substrate-related-operation performing apparatus comprises a head-related-information recognizing portion which recognizes, based on the individual information, head-related information related to the operation performing head attached to the apparatus.

When the operation performing head that can be detachably attached is attached to the substrate-related-operation performing apparatus, the usability of the apparatus is further improved if the construction, status, etc. of the head can be grasped by the apparatus. As will be described in detail later, if the construction-related factors of the head attached to the apparatus can be automatically recognized by the apparatus, the apparatus can automatically carry out, e.g., steps of preparing use of the head (hereinafter, referred to as the "head-use preparing steps", where appropriate). The head-use preparing steps include selecting a software to drive the head, or calibrating the head, and additionally include judging whether the head is appropriate for use. The present mode is advantageous when the head-use preparing steps are automatically carried out.

The head-related information used in the present mode may include head-construction-factor information, head-status information, etc. that will be described later. In the present mode, the operation performing head has its own individual information. That is, the individual information used in the present mode is information recorded in the head per se, and accordingly it can be called "head-stored information". The individual information includes information that is used in obtaining the head-related information; such as head ID (identification) information representing an ID of the operation performing head, or head type information representing a type of the head. The individual-information recording medium may be a memory element such as a ROM or a RAM, or a medium, such as an in-line package switch, that is electrically connectable to provide information recorded thereby. Alternatively, the recording medium may be a medium, such as a bar code or a 2D (two-dimensional) code (also called "QR code") that is recognizable by a visual or optical means so as to obtain information. Otherwise, the recording medium may be selected from various sorts of media, for example, a recording medium, such as a tag chip, that includes a wireless communication means; or a recording medium that utilizes, e.g., magnetism. When the operation performing head employs, as the individual-information recording medium, a particular sort of recording medium, the substrate-related-operation performing apparatus employs a means that can obtain or recognize information from that sort of recording medium.

The head-related-information recognizing portion recognizes, based on the individual information, the head-related information. For example, the recognizing portion may be one that performs calculations based on the individual information and recognizes results of the calculations as the head-related information, or one that obtains, by using the individual information as a key, some information from inside or outside the substrate-related-operation performing apparatus, and recognizes the obtained information as the head-related information. Alternatively, the individual information may contain the head-related information. In this case, the head has the head-related information, and the recognizing portion recognizes the head-related information by just obtaining the individual information.

(6) The substrate-related-operation performing apparatus according to the mode (5), wherein the head-related-information recognizing portion comprises a construction-related-factor-information recognizing portion which recognizes, as the head-related information, a head-construction-related-factor information representative of at least one factor related to a construction of the operation performing head attached to the apparatus.

In the present mode, the head-related information includes at least one factor related to the construction of the operation performing head. The head-construction-related factor may be head-type information representing a type of the head, or information representing respective positions where various constituent elements of the head are provided. Concerning a mounting head as an example of the operation performing head, the head-type information may be information that can identify a particular type of the mounting head, such as a name indicative of that type; the greatest number of suction nozzles that can be attached to the head; or shapes, sorts, or mounting speeds of suction nozzles that can be attached to the head. In addition, the information representing the constituent-element provision positions may be respective positions in a vertical or horizontal direction where holding members that hold respective suction nozzles are provided in the mounting head. As will be described later, the head-construction-related-factor information can be used as information to select a driver that operates the operation performing head attached; information to judge whether the head attached is appropriate for use; or information to determine a reference position used in operating the mounting head.

(7) The substrate-related-operation performing apparatus according to the mode (6), further comprising a driver storage portion in which an operation-performing-head driver as a software for enabling an operation of the operation performing head attached to the apparatus, is stored; and a head responding portion which stores, in the driver storage portion, the operation-performing-head driver corresponding to the operation performing head attached to the apparatus, based on the head-construction-related-factor information recognized by the construction-related-factor-information recognizing portion.

Generally, the operation of the substrate-related-operation performing apparatus is controlled by a control device that is essentially constituted by a computer, and the operation performing head, a feeder, etc. is driven according to an exclusive software, i.e., a so-called "driver". Thus, a driver that operates the operation performing head can be called "an operation-performing-head driver", and different sorts of operation performing heads need respective appropriate drivers. There is nothing the matter with the conventional substrate-related-operation performing apparatus wherein the operation performing head thereof cannot be replaced, i.e., is fixed. On the other hand, in the present substrate-related-operation performing apparatus wherein the operation performing head thereof can be replaced, it is needed to select a driver that corresponds to the operation performing head attached to the apparatus, more specifically described, corresponding to the construction of the head. In the present mode, the driver corresponding to the head can be automatically selected, and accordingly the head can be easily replaced with another head. In the case where a plurality of sorts of drivers are prepared, those drivers may be stored either inside or outside the substrate-related-operation performing apparatus. In the latter case, the selected driver is transmitted from outside to the apparatus. Thus, the present mode is one of the modes that enable the substrate-related-operation performing apparatus to perform automatically the head-use preparing steps when the operation performing head is replaced with another head.

(8) The substrate-related-operation performing apparatus according to the mode (6) or (7), further comprising a position-information obtaining portion which obtains, based on the head-construction-related-factor information recognized by the construction-related-factor-information recognizing portion, a constituent-element position information related to an operative movement of a constituent element of the operation performing head attached to the apparatus.

The operation performing head is a precise element, but may have some manufacturing errors. In a substrate-related-operation performing apparatus wherein the operation performing head thereof is fixed, respective positions of the head per se or constituent elements thereof are adjusted after the head is assembled with the apparatus, so that the manufacturing errors of the head may not adversely influence accuracy of an operation to be performed by the head. On the other hand, in the substrate-related-operation performing apparatus wherein the operation performing head thereof can be replaced with another head, in particular, wherein an arbitrarily selected one of various sorts of operation performing heads can be detachably attached, manufacturing errors of each head, or attachment of the head to a deviated position may adversely influence the accuracy of the operation. The present mode is for automatically adjusting positions related to the head, so as to eliminate the influences caused by the errors or the like, that is, carrying out so-called "calibration". For example, based on the recognized information representing factors of the constituent elements, in particular, information representing positions where the constituent elements are provided, the position-information obtaining portion obtains information representing respective positions of the head attached, and the constituent elements thereof, in the apparatus and carries out, based on the obtained information, adjustments of the positions corresponding to the head attached. When the substrate-related operation is performed, the operation performing head and the circuit substrate are moved relative to each other, the adjustments of positions include modification of pre-set positions related to the relative movement. Concerning, e.g., the mounting head, it is possible to adjust, based on information representing a position in a vertical or horizontal direction where a suction-nozzle holding member as a constituent element of the head is provided in the head, a pre-set position related to a relative movement of a suction nozzle or the mounting head.

(9) The substrate-related-operation performing apparatus according to any of the modes (5) through (8), wherein the head-related-information recognizing portion comprises a status-information recognizing portion which recognizes, as the head-related information, a head status information related to a status of the operation performing head attached to the apparatus.

The present mode is for recognizing, based on the individual information obtained from the operation performing head attached to the substrate-related-operation performing apparatus, the information related to the status of the head. The head-status information may include, e.g., a state in which the head is used, or a state of the head that is related to an accuracy of an operation performed thereby. In addition, the head-status information may include not only a state of the head per se, but also a state of the head in relation with the apparatus, e.g., a compatibility of the head with the apparatus. More specifically described, the head-status information may be how long the head has been operated; a time that has elapsed after the last maintenance is carried out on the head; a failure rate of the head; or a failure rate of the head when the particular head is attached to the particular apparatus. The head-status information can be used in, e.g., judging whether the head is appropriate for use, as will be described later. The head-status information may be recognized by gaining, based on the individual information of the operation performing head, access to a data base including respective production or maintenance histories of various operation performing heads.

(10) The substrate-related-operation performing apparatus according to the mode (9), further comprising a head judging portion which judges, based on the head status information recognized by the status-information recognizing portion, whether the operation performing head attached to the apparatus is appropriate.

The present mode is for judging, based on the status of the operation performing head, whether the head is appropriate, i.e., whether it is appropriate to perform the operation using the head attached to the substrate-related-operation performing apparatus. For example, the head judging portion may judge whether the head per se is in a bad state and accordingly cannot be used; or whether the head is not compatible with the apparatus and accordingly the use of the head is not appropriate. The step of judging whether the head attached is appropriate for use may be carried out as one of the head-use preparing steps. Thus, the present mode is one of the modes that enable the head-use preparing steps to be automatically carried out. However, in a different mode than the present mode, the present substrate-related-operation performing apparatus may be modified such that the apparatus makes the above judgment based on not the head-status information but the head-construction-related-factor information. In addition, according to a feature of the present mode, the apparatus may make the above judgment based on both the head-status information and the head-construction-related-factor information.

(11) The substrate-related-operation performing apparatus according to any of the modes (1) through (10), further comprising an operation-performing-head moving device which includes an X-direction moving device which includes an operation-performing-head supporting member to which the operation performing head is attached, and moves the operation-performing-head supporting member in an X direction along a straight line; and a Y-direction moving device which moves the X-direction moving device in a Y direction perpendicular to the X direction, wherein the operation-performing-head moving device moves the operation performing head on a plane parallel to the circuit substrate.

(12) The substrate-related-operation performing apparatus according to the mode (11), wherein in a state in which the operation performing head is attached to the operation-performing-head supporting member, a length of a combination of the operation performing head and the operation-performing-head supporting member, in the X direction, is not more than 60 mm.

(13) The substrate-related-operation performing apparatus according to the mode (11) or (12), wherein a weight of the combination of the operation performing head and the operation-performing-head supporting member is not more than 5 kg.

(14) The substrate-related-operation performing apparatus according to any of the modes (11) through (13), further comprising an image taking device which takes an image of a fiducial mark affixed to a surface of the circuit substrate and which is supported by the operation-performing-head supporting member such that the image taking device is located at a position aligned, in the Y direction, with the operation performing head attached to the operation-performing-head supporting member.

In each of the above-indicated four modes (11) through (14), the substrate-related-operation performing apparatus can enjoy a small size, or a small load applied to the operation-performing-head moving device. However, each of the above-indicated four modes is applicable to a substrate-related-operation performing apparatus wherein an operation performing head thereof cannot be replaced with another head, i.e., is fixedly provided.

(15) A substrate-related-operation performing head for use with a substrate-related-operation performing apparatus, characterized in that the operation performing head is detachably attached to the substrate-related-operation performing apparatus, and is operated for the substrate-related-operation performing apparatus to perform an operation related to a circuit substrate.

(16) The substrate-related-operation performing head according to the mode (15), wherein the substrate-related-operation performing apparatus comprises a substrate holding device which fixes and holds the circuit substrate; and a component supplying device which supplies a plurality of circuit components, and wherein the operation performing head comprises a mounting head which holds each of the circuit components supplied by the component supplying device, takes said each circuit component from the component supplying device, and mounts said each circuit component on a surface of the circuit substrate fixed and held by the substrate holding device.

(17) The substrate-related-operation performing head according to the mode (15) or (16), comprising an individual-information recording medium in which individual information related to the operation performing head is recorded.

The above-indicated various modes of the operation performing head in accordance with the present invention are preferably employed by the above-described various modes of the substrate-related-operation performing apparatus in accordance with the present invention. Therefore, the description of the former modes is omitted here.

(18) A substrate-related-operation performing system comprising a substrate-related-operation performing apparatus which includes an operation performing head that is detachably attached to the apparatus, and which operates, in a state in which the operation performing head is attached to the apparatus, the operation performing head, and thereby performs an operation related to a circuit substrate, the substraterelated-operation performing system being characterized in that the operation performing head attached to the apparatus comprises an individual-information recording medium in which individual information related to the operation performing head is recorded, and that the system comprises a head-related-information external storage portion which stores, outside the substrate-related-operation performing apparatus, a plurality of batches of head-related information respectively related to a plurality of said operation performing heads; and a head-related-information recognizing portion which obtains and recognizes, based on the individual information, the batch of head-related information corresponding to the operation performing head attached to the apparatus, from the head-related-information external storage portion.

The substrate-related-operation performing system in accordance with the present invention includes the substrate-related-operation performing apparatus wherein the operation performing head thereof can be replaced with another head, and obtains the above-described head-related information, from an external device provided outside the apparatus. The description of the present system is omitted with respect to a portion thereof that is a duplication of the foregoing description. The head-related-information external storage portion is, e.g., a device that is essentially constituted by a computer and functions like a data base. As previously described, the head-related information may include the head-construction-related-factor information or the head-status information. Therefore, the external storage portion may include respective data bases corresponding to the different sorts of head-related information, respectively. For example, the external storage portion may employ a data base that stores respective production history of the substrate-related-operation performing apparatus and the operation performing head, and a data base that stores various sorts of information related to the constituent devices or elements of the substrate-related-operation performing apparatus. Therefore, the present system may employ one or more head-related-information external storage portion or portions. In addition, the head-related-information recognizing portion may be integral with, or separate from, the substrate-related-operation performing apparatus. In the latter case, for example, if a management device that is essentially constituted by a computer, manages a plurality of substrate-related-operation performing apparatuses in an integrated manner, and functions like a host computer is employed by the present system, the management device may be used as the separate information recognizing portion. Alternatively, the above-indicated device that functions like the data base may be used as the separate information recognizing portion.

The substrate-related-operation performing system in accordance with the present invention may be embodied such that the head-related-information recognizing portion includes at least one of the head-construction-related-factor-information recognizing portion and the head-status-information recognizing portion, or alternatively such that the head-related-information recognizing portion includes at least one of the head judging portion, the head responding portion, and the position-information obtaining portion. Each of the head-construction-related-factor-information recognizing portion, the head-status-information recognizing portion, the head judging portion, the head responding portion, and the position-information obtaining portion may be provided integrally with either the substrate-related-operation performing apparatus, or the above-indicated management device or the device that functions like the data base. The present system may be embodied in each of the above-described manners, i.e., the manner that the operation performing head can be replaced with another head, the manner that the different sorts of operation performing heads having the different constructions can be replaced with each other, and the manner that the substrate-related-operation performing apparatus is limited to the component mounting apparatus.

(19) A program which is implemented by a computer to prepare for use of an operation performing head which is detachably attached to a substrate-related-operation performing apparatus and which is operated for the substrate-related-operation performing apparatus to perform an operation related to a circuit substrate, the program being characterized by comprising an individual-information reading step of reading, from an individual-information recording medium which is provided in the operation performing head attached to the apparatus, individual information related to the operation performing head, and a head-related-information recognizing step of recognizing, based on the read individual information, head-related information related to the operation performing head attached to the apparatus.

(20) The operation-performing-head-use preparing program according to the mode (19), wherein the head-related-information recognizing step comprises a construction-related-factor-information recognizing step of recognizing, as the head-related information, head-construction-related-factor information representative of at least one factor related to a construction of the operation performing head attached to the apparatus.

(21) The operation-performing-head-use preparing program according to the mode (20), further comprising a head responding step of storing, in a driver storage portion in which an operation-performing-head driver as a software for enabling an operation of the operation performing head attached to the apparatus, is stored, the operation-performing-head driver corresponding to the operation performing head attached to the apparatus, based on the recognized head-construction-related-factor information.

(22) The operation-performing-head-use preparing program according to the mode (20) or (21), further comprising a position-information obtaining step of obtaining, based on the recognized head-construction-related-factor information, a constituent-element position information related to an operative movement of a constituent element of the operation performing head attached to the apparatus.

(23) The operation-performing-head-use preparing program according to any of the modes (19) through (22), wherein the head-related-information recognizing step comprises a status-information recognizing step of recognizing, as the head-related information, a head status information related to a status of the operation performing head attached to the apparatus.

(24) The operation-performing-head-use preparing program according to the mode (23), further comprising a head judging step of judging, based on the recognized head status information, whether the operation performing head attached to the apparatus is appropriate.

The above-indicated various modes of the operation-performing-head-use preparing program in accordance with the present invention are related to a program for enabling an automatic preparation of the use of the operation performing head detachably attached to the substrate-related-operation performing apparatus. Since the description of those modes is a duplication of the foregoing description, it is omitted here. It is, however, to be noted that each of those modes may be embodied in each of the above-described manners, i.e., the manner that the operation performing head can be replaced with another head, the manner that the different sorts of operation performing heads having the different constructions can be replaced with each other, and the manner that the substrate-related-operation performing apparatus is limited to the component mounting apparatus.

BEST MODE FOR CARRYING OUT THE INVENTION

Hereinafter, there will be described in detail, by reference to the drawings, embodiments of the present invention. It is, however, to be understood that the present invention is by no means limited to the details of those embodiments but may be embodied with various changes and improvements, such as those described in DISCLOSURE OF THE INVENTION, that may occur to a person skilled in the art.

<Construction of Substrate-Related-Operation Performing Apparatus>

Figure 1:
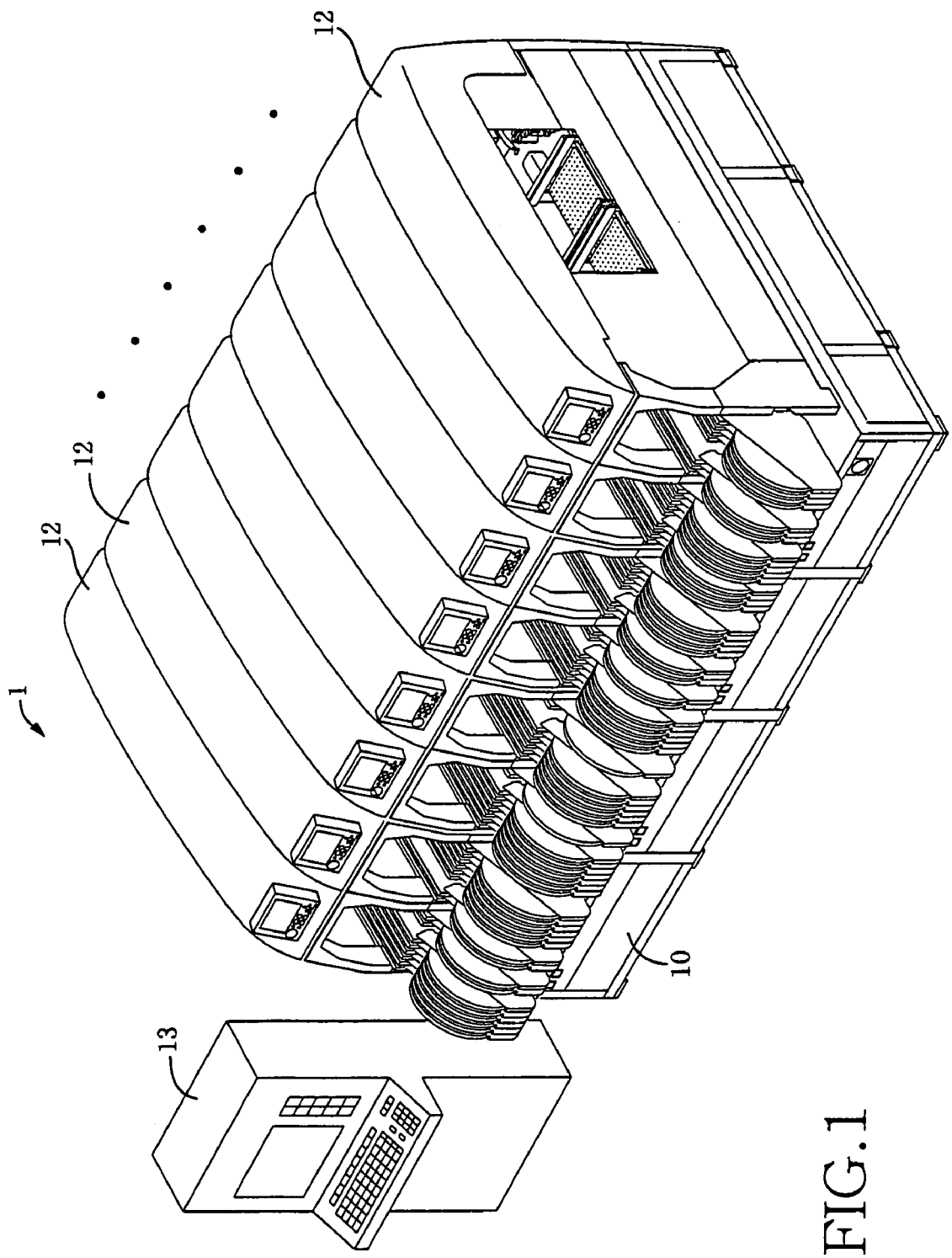
FIG. 1 is a perspective view of a general arrangement of a substrate-related-operation performing apparatus as an embodiment of the present invention.

FIG. 1 is a perspective view of a substrate-related-operation performing apparatus 1 as an embodiment of the present invention. The substrate related operation performing apparatus 1 includes a base module 10; a plurality of (eight) operation performing modules 12 that are provided on the base module 10 such that the operation performing modules 12 are adjacent to each other and are arranged in an array; and a control module 13 that is separate from the base module 10 and the operation performing modules 12 and functions as an operation-performing-apparatus control device. The operation performing modules 12 have a substantially identical hardware construction except for an operation performing head 21, described later, and are arranged in a direction in which each circuit substrate is fed. In the description of the substrate related operation performing apparatus 1, the direction in which the operation performing modules 12 are arranged will be referred to as the "left-and-right" direction; and a direction perpendicular to the left-and-right direction will be referred to as the "front-and-rear" direction. Thus, a left and front portion of the figure will be referred to as the "front" side of the substrate related operation performing apparatus 1; and a right and rear portion of the figure will be referred to as the "rear" side of the same 1. In addition, the left side of the substrate related operation performing apparatus 1 is an upstream side of the apparatus 1; and the right side of the apparatus 1 is a downstream side thereof. Thus, as each circuit substrate is fed from the operation performing modules 12 located in the left, toward the modules 12 located in the right, the modules 12 sequentially perform respective operations related to the each circuit substrate.

Each one of the operation performing modules 12 employed by the substrate related operation performing apparatus 1 can function as a substrate-related-operation performing apparatus in accordance with the present invention and, as far as the present invention is concerned, each operation performing module 12 can be construed as the substrate-related-operation performing apparatus. However, as far as the present embodiment is concerned, it is construed that the plurality of operation performing modules 12 cooperate with each other to function as the substrate-related-operation performing apparatus in accordance with the present invention. In addition, though each operation performing module 12 can be used with various sorts of operation performing heads 21 such as an adhesive applying head or an inspection performing head, it is assumed, in the present embodiment, for easier understanding purposes only, that the operation performing head with which each operation performing module 12 is used is only a mounting head that mounts a circuit component such as an electronic component on a circuit substrate. Thus, each operation performing module 12 functions as a mounting module; and the substrate related operation performing apparatus 1 functions as a component mounting apparatus. In the following description, the substrate related operation performing apparatus 1 may be referred to as the component mounting apparatus 1, and the operation performing modules 12 may be referred to as the mounting modules 12, where the description is focused on the component mounting operation as the substrate-related operation.

Figure 2:
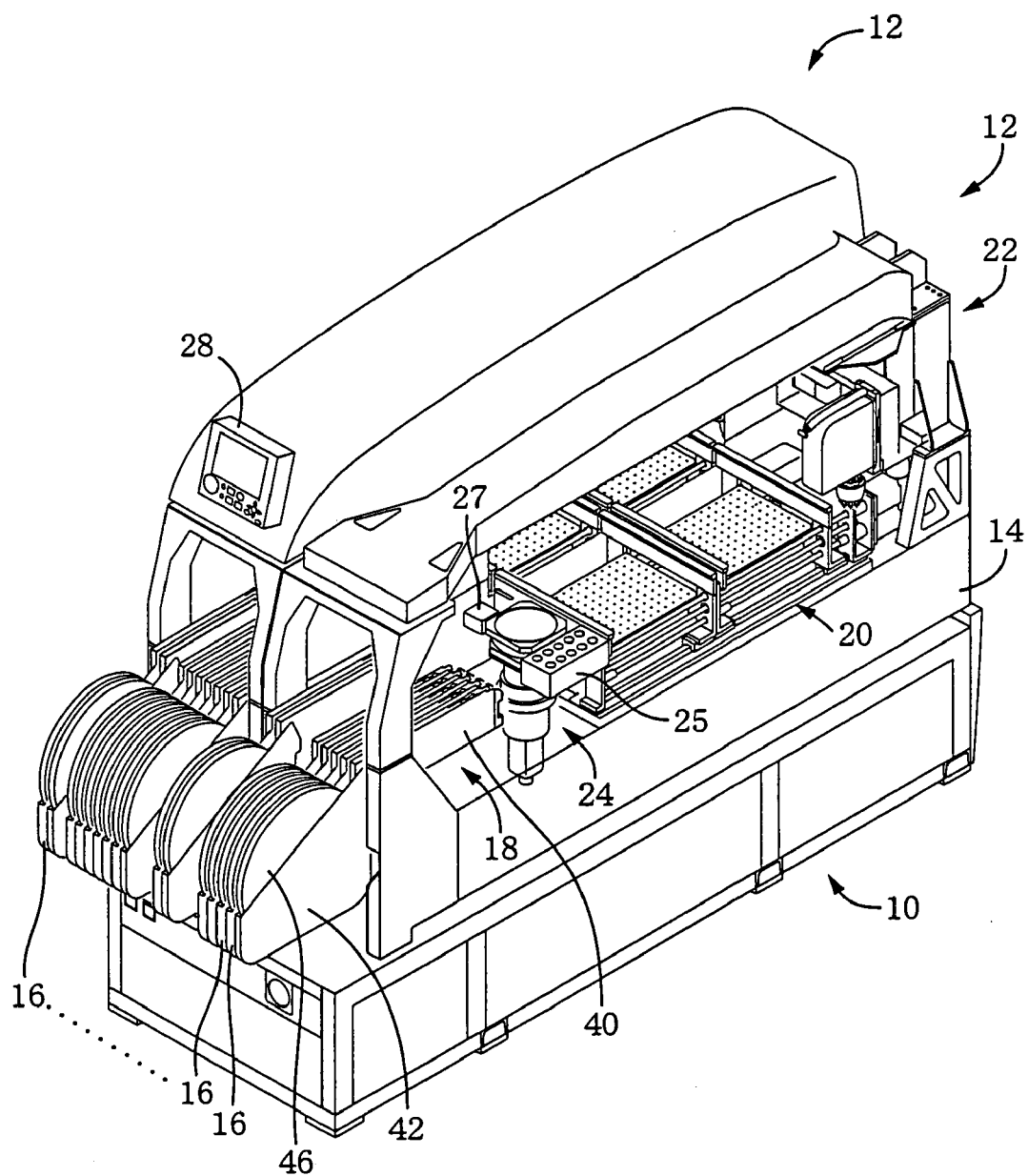
FIG. 2 is a perspective view of an arrangement of an operation performing module constituting a portion of the substrate-related-operation performing apparatus.

FIG. 2 is an enlarged view of two mounting modules 12 out of the above-described eight mounting modules 12, and shows the right mounting module 12 in a state in which a cover member thereof is removed. As shown in the figure, each mounting module 12 includes a frame 14 functioning as a main body thereof, and various devices that are supported by the frame 14, for example, a plurality of tape feeders (hereinafter, referred to as the "feeders", if appropriate) 16, arranged in an array, each of which functions as a component supplying device that supplies a plurality of circuit components, one by one, from a pre-determined component supplying position; a conveyor unit 20 as a substrate holding device that has a function of feeding each circuit substrate and fixedly holds the each circuit substrate at a pre-determined operation performing position; and a substrate-related-operation performing device 22 that includes an operation performing head 21, and moves the operation performing head 21 within an operation performing area, so that the head 21 performs an operation related to the each circuit substrate. In the present embodiment, the operation performing head 21 functions as a mounting head that holds and takes a circuit component supplied by an appropriate one of the feeders 16, and mounts the component on a circuit substrate fixedly held by the conveyor unit 20; and the substrate-related-operation performing device 22 functions as a mounting device. In the following description, the operation performing head 21 may be referred to as the mounting head 21, and the substrate-related-operation performing device 22 may be referred to as the mounting device, where the description is focused on the component mounting operation.

In addition, each mounting module 12 includes a component camera 24 (i.e., a CCD camera) that is provided between a group 18 of the feeders 16 (hereinafter, referred to as the "feeder group", if appropriate) and the conveyor unit 20 and mainly functions as a component-image taking device; a nozzle stocker 25 as a component-holding-device storing device that stores a plurality of suction nozzles each as a component holding device, described later; and a nozzle-end-height detector 27, described later. Moreover, each mounting module 12 includes a module control device 26 (see FIG. 9) that controls itself, i.e., respective operations of the above-described various devices. In addition, each mounting module 12 includes an operation and display panel 28 as an input and output device that is provided in a top portion thereof and is connected to the module control device 26. The operation and display panel 28 receives various commands, information, etc. that are inputted by an operator, and displays information, etc that represents a status of the mounting module 12 and the constituent elements thereof, etc.

Each of the feeders 16 essentially includes a tape feeding portion 40 and a reel holding portion 42. The reel holding portion 42 holds a reel 46 around which a circuit-component tape as circuit components supported by a base tape and a cover tape (in particular, electronic components supported by base and cover tapes may be called an electronic-component tape) is wound. The tape feeding portion 40 includes a drive source, and feeds, from the reel 46, the circuit-component tape at a tape feeding pitch equal to a component holding pitch at which the tape holds the circuit components, such that the feeding of the tape corresponds to the operation of the mounting device 22. As the circuit-component tape is fed, the cover tape is peeled off the base tape and the circuit components are supplied, one by one, from the pre-determined component supplying position. Since the feeders 16 and the circuit-component tape are well known in the art, no further description thereof is provided here.

Figure 3:
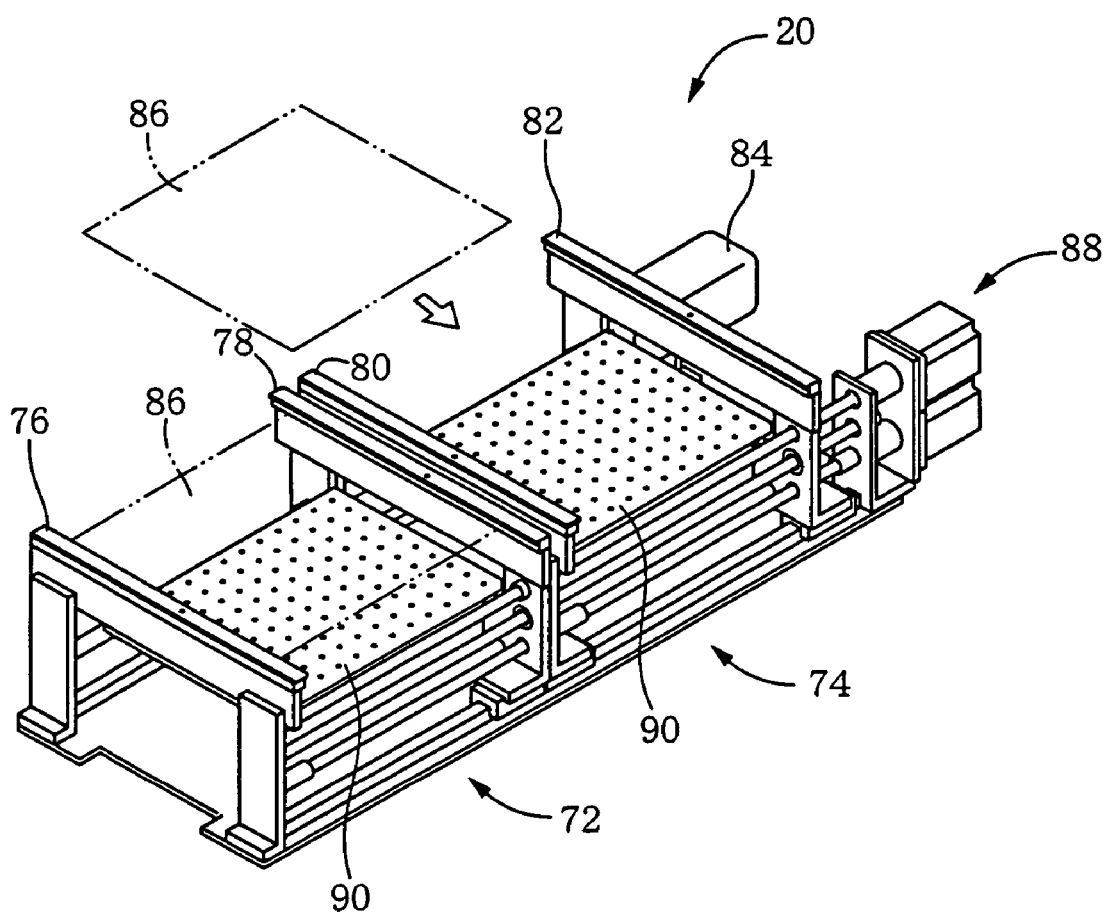
FIG. 3 is a perspective view of a conveyor unit employed by the operation performing module.

As shown in FIG. 3, the conveyor unit 20 is essentially constituted by two conveyor devices, i.e., a front conveyor 72 and a rear conveyor 74. The front conveyor 72 includes two conveyor rails 76, 78 that are opposed to each other; and the rear conveyor 74 includes two conveyor rails 80, 82 that are opposed to each other. Conveyor belts, not shown, are circulated under the conveyor rails 76, 78, 80, 82, respectively, by a conveyor motor 84. A circuit substrate 86 is fed while being supported by each pair of conveyor belts. The mounting modules 12 employ the respective conveyor units 20, such that the conveyor units 20 are arranged along a straight line in the component mounting apparatus 1. The respective conveyor units 20 of the mounting modules 12 cooperate with each other to feed the circuit substrate 86. Thus, the conveyor units 20 cooperate with each other to constitute a substrate feeding device of the component mounting apparatus 1. Each of the conveyor rails 78, 80, 82 other than the conveyor belt 76 can be moved in the front-and-rear direction, by a conveyor-width adjusting motor 88, so as to adjust freely a width of each conveyor unit 20. If only one of the front and rear conveyors 72, 74 is used, a circuit substrate having a great width can be fed by the one conveyor.

When the conveyor motor 84 is operated or driven, the circuit substrate 86 is fed into the operation performing area, and is stopped at the operation performing position as a pre-determined stop position. Each conveyor unit 20 has, in a lower portion thereof, circuit-substrate support plates (hereinafter, referred to as the "support plates", if appropriate) 90 that are moved upward and downward by respective elevating and lowering devices, not shown. On each of the support plates 90, there are provided a plurality of support pins, not shown, such that each of the support pins can be moved to an arbitrary position. When each support plate 90 is moved upward, the circuit substrate 86 is moved upward while being supported by the support pins, so that the circuit substrate 86 is lifted off the conveyor belts and is sandwiched by respective portions of the conveyor rails 76, 78 or the conveyor rails 80, 82, and the support pins. Thus, the circuit substrate 86 is fixed at the above-described operation performing position. The circuit substrate 86 can be released by lowering the support plate 90. Thus, the conveyor unit 20 of each mounting module 12 functions as a substrate holding device.

Figure 4:
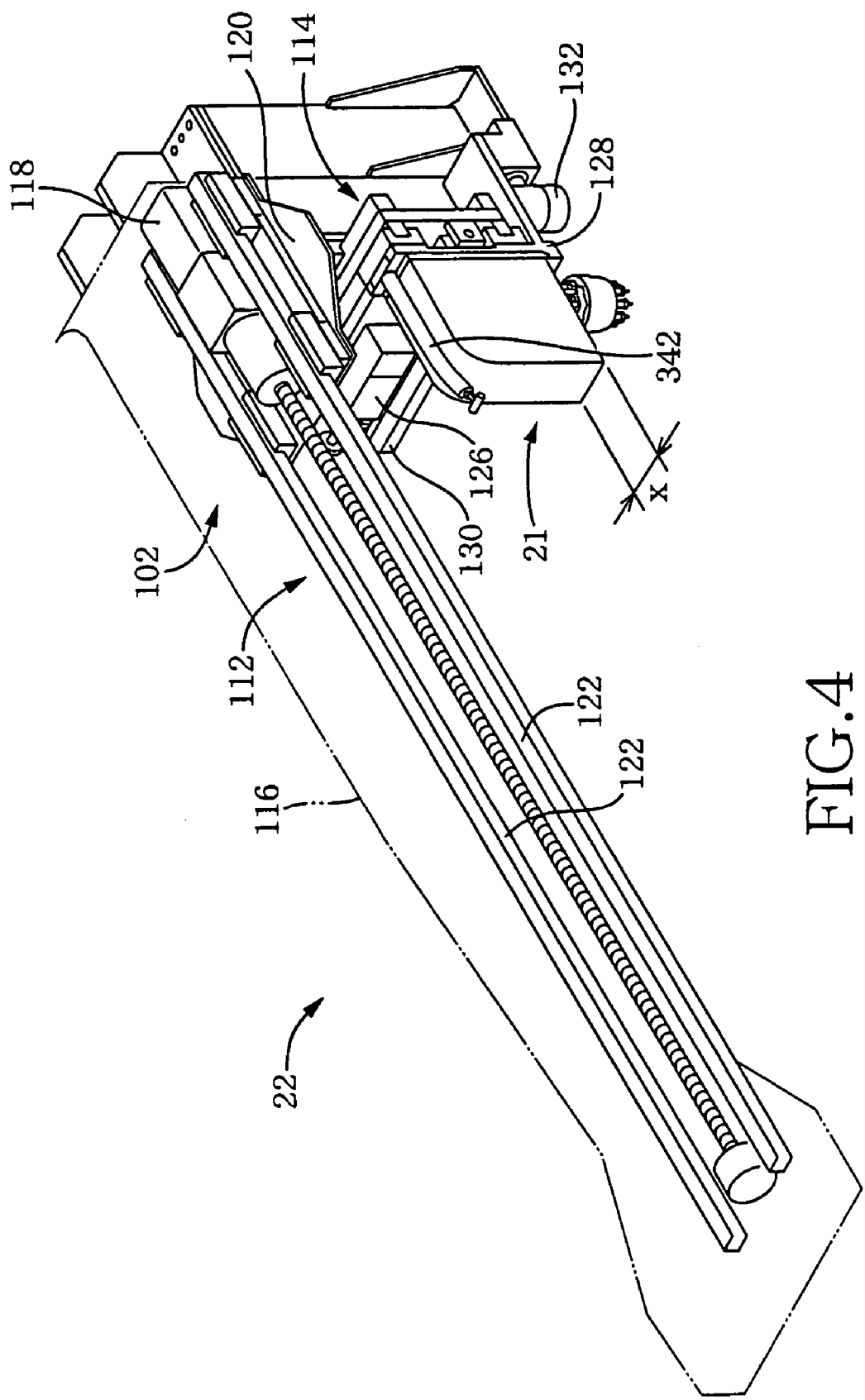
FIG. 4 is a perspective view of a substrate-related-operation performing device employed by the operation performing module.

As shown in FIG. 4, the mounting device 22 includes the mounting head 21, and a head moving device 102 (as a mounting-head moving device) that moves the mounting head 21 along a substantially one plane within the operation performing area. The head moving device 102 is a sort of relatively moving device that moves at least one of the mounting head 21 and the circuit substrate 86 held by the conveyor unit 20, relative to the other of the mounting head 21 and the circuit substrate 86. The mounting head 21 will be described in detail, later. The head moving device 102 is an X-Y-robot-type moving device, and includes a Y-slide device 112 as a Y-direction moving device that moves the mounting head 21 in the front-and-rear direction (i.e., Y direction); and an X-slide device 114 as an X-direction moving device that moves the mounting head 21 in the left-and-right direction (i.e., X direction). The Y-slide device 112 is supported by a beam member 116 as a portion of the frame 14, and includes a Y slide 120 and a Y-axis motor 118 that moves, via a ball screw, the Y slide 120 along Y guides 122. The X-slide device 114 is supported by the Y slide 120, and includes an X slide 128 and an X-axis motor 126 that moves, via a ball screw, the X slide 128 along X guides 130. The mounting head 21 is attached to the X slide 128 as an operation-performing-head supporting member. A device for attaching the head 21 to the X slide 128 will be described later. The head moving device 102 moves the mounting head 21 from the feeder group 18 to the circuit substrate 86 fixed by the conveyor unit 20, and vice versa. The X slide 128 supports, in a lower portion thereof, a mark camera 132 (i.e., a CCD camera). The mark camera 132 functions as a substrate-image taking device, and takes respective images of fiducial marks affixed to a surface of the circuit substrate 86. The head moving device 102 moves the mark camera 132 together with the mounting head 21.

<Construction of Operation Performing Head, and Manner of Attaching and Detaching the Head>

Figure 5:
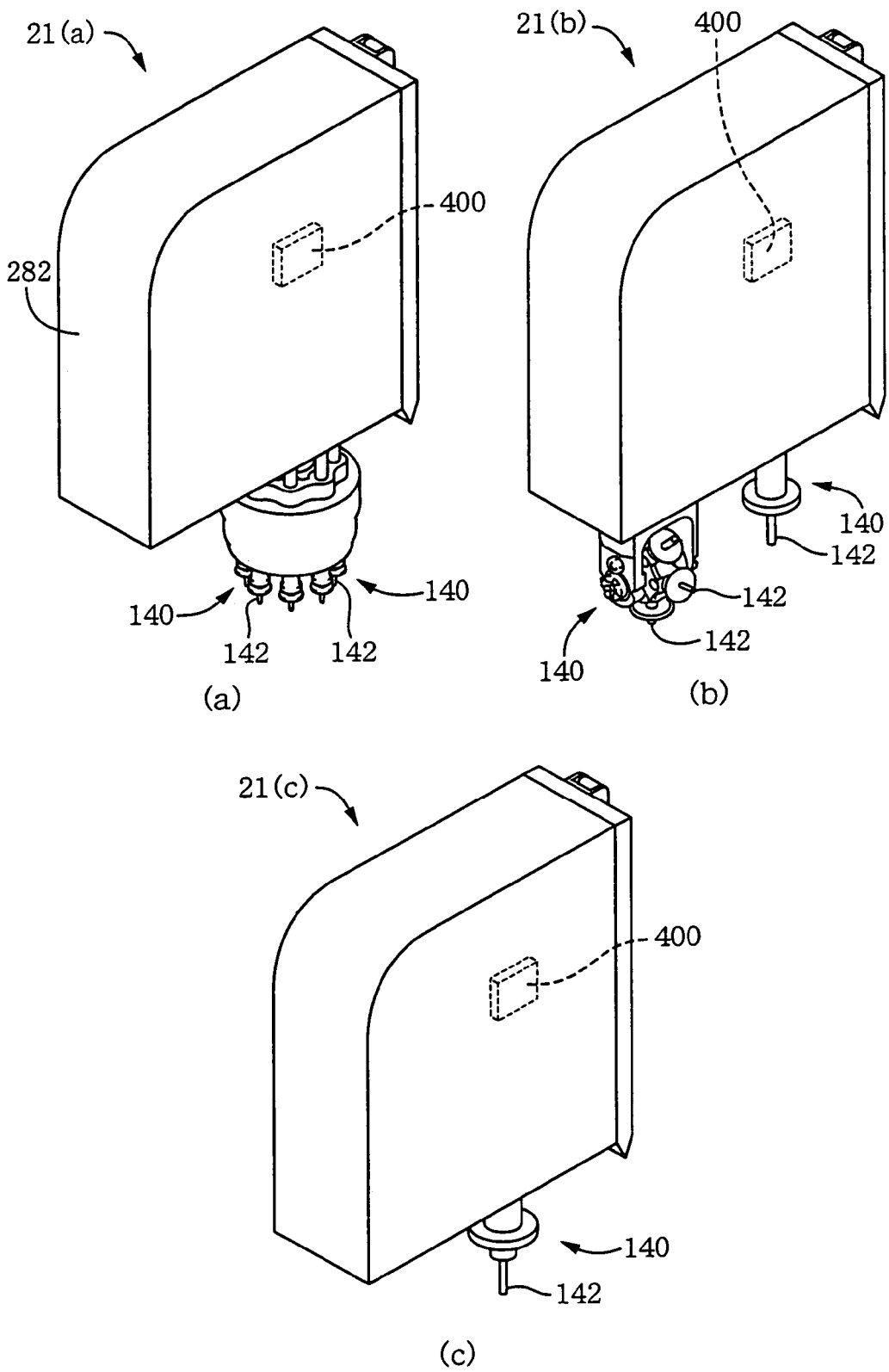
FIG. 5 shows respective perspective views of three mounting heads each of which can be attached to the substrate-related-operation performing device.

In the present embodiment, the mounting head 21 as the operation performing head is attachable to, and detachable from, the head moving device 102. More specifically described, an arbitrary one of a plurality of sorts of mounting heads 21 having different constructions is selected, and the selected mounting head 21 is detachably attached to the head moving device 102. That is, the mounting device 22 allows a sort of mounting head 21 to be replaced with another sort of mounting head 21. FIGS. 5(*a*), 5(*b*), and 5(*c*) show three sorts of mounting heads 21*a*, 21*b*, 21*c*, respectively, each of which can be detachably attached as the operation performing head 21 to the head moving device 102. Briefly described, the mounting head 21*a*, shown in FIG. 5(*a*), includes a plurality of (eight) mounting units 140 each having a bar-like shape, and intermittently revolves the mounting units 140. Each of the mounting units 140 has, in a lower end portion thereof, a suction nozzle 142 as a component holding device that holds, by suction, a circuit component. In a state in which the mounting head 21*a* is positioned above the feeder group 18, one of the mounting units 140 is moved downward, so that the suction nozzle 142 of the one mounting unit 140 may hold a circuit component supplied at the component supplying position of one of the feeders 16, and take the component from the one feeder 16. As the mounting units 140 are intermittently revolved, the mounting units 140 sequentially take respective circuit components. In a state in which the mounting units 140 hold the respective circuit components, the mounting head 21*a* is moved to a position above the circuit substrate 86 fixedly held by the conveyor unit 20. Then, one of the mounting units 140 that is currently positioned at the same position as the position where each mounting unit 140 is moved downward to take the circuit component, is moved downward so that the circuit component currently held by the one mounting unit 140 may be mounted on the surface of the circuit substrate 86. As the mounting units 140 are intermittently revolved, the mounting units 140 sequentially mount the respective circuit components held thereby, on the circuit substrate 86. Thus, the mounting head 21*a* is preferably used to mount, at a high speed, circuit components having a considerably small size. A mounting head, not shown, that is of the same sort as that of the mounting head 21*a* but has a different number of mounting units 140 than the number of the mounting units 140 of the mounting head 21*a*, may be attached as the mounting head 21 to the head moving device 102.

The mounting head 21*c*, shown in FIG. 5(*c*), has a single mounting unit 140. At a position above one of the feeders 16, and at a position above the circuit substrate 86, the single mounting unit 140 is moved downward. Thus, when the mounting head 21*c* is reciprocated one time between the one feeder 16 and the circuit substrate 86, one circuit component is mounted on the circuit substrate 86. A mounting speed at which the mounting head 21*c* mounts circuit components is considerably low, but the mounting head 21*c* can support a suction nozzle 142 having a considerably large size and accordingly can mount circuit components having a considerably large size or a special shape. Thus, the mounting head 21*c* can be used as a general-purpose mounting head 21. The mounting head 21*b*, shown in FIG. 5(*b*), has two mounting units 140. Thus, the mounting head 21*b* has its characteristics that are intermediate between those of the mounting head 21*a* and those of the mounting head 21*c*. A front-side one of the two mounting units 140 has a plurality of suction nozzles 142 that radially extend from an axis line perpendicular to the axis line of the one mounting unit 140, such that the suction nozzles 142 can be revolved around the former axis line and accordingly an arbitrary one of the suction nozzles 142 can be selected for use. Each mounting module 12 can be used with one of the above-described various sorts of mounting heads 21 that is arbitrarily selected depending upon the sort of the mounting operation to be performed. Each of FIGS. 2 and 4 shows the mounting head 21*a* employed as the mounting head 21.

Figure 6:
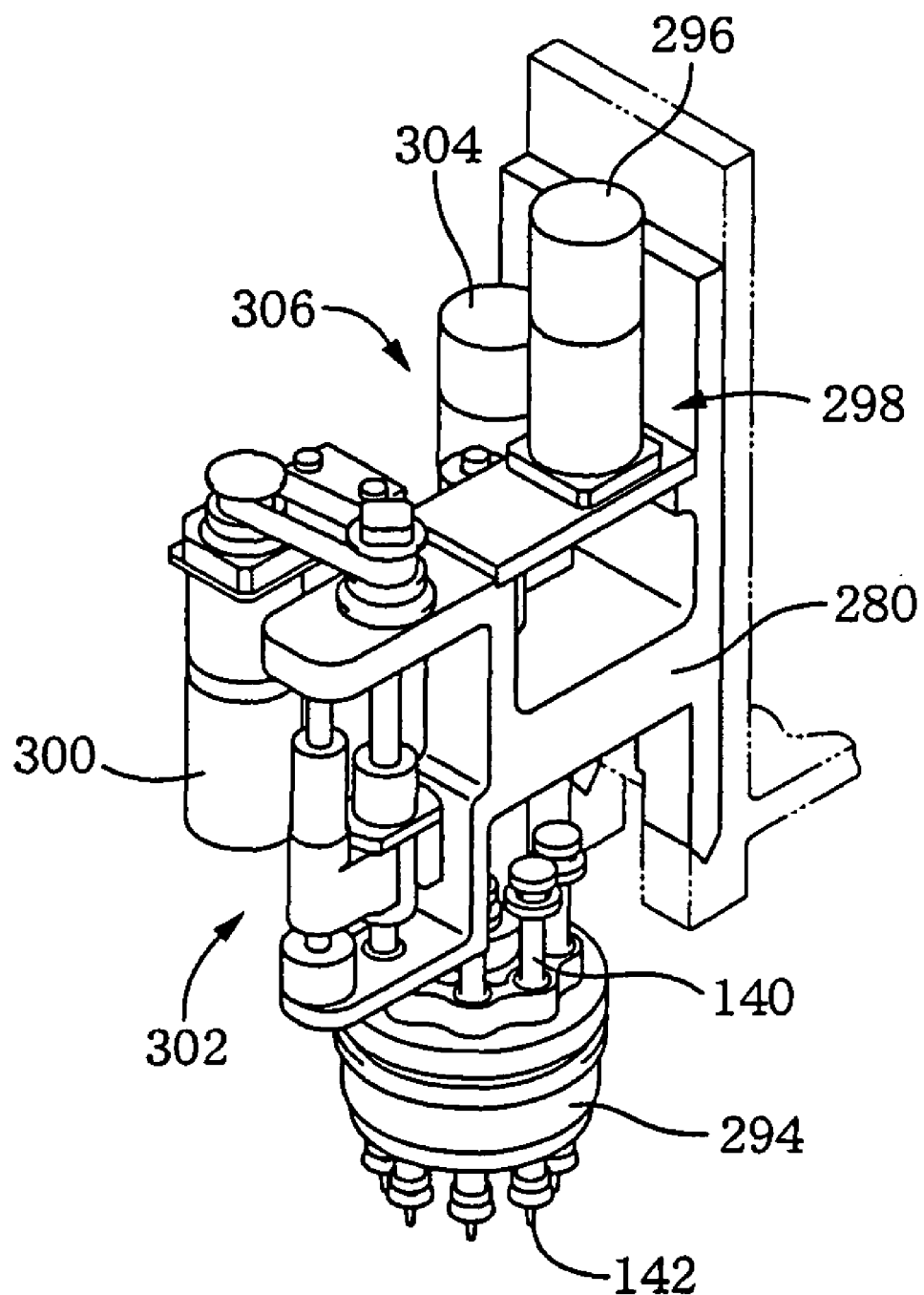
FIG. 6 is a perspective view of a mounting head that can be attached to the substrate-related-operation performing device.

The construction of the mounting head 21 will be described in more detail by reference to the mounting head 21*a* shown in FIG. 6. The mounting head 21*a* is constructed to include a main body 280 as a skeleton thereof, various constituent components or devices thereof that are provided in respective areas, and a cover member 282 (see FIG. 5). FIG. 6 shows the mounting head 21*a* with the cover member 282 being removed.

The mounting head 21*a* includes a plurality of, e.g., eight mounting units 140 each of which holds, in a free end portion thereof, a suction nozzle 142 as a circuit-component holding device. Though not shown, each suction nozzle 142 communicates with a negative pressure air channel and a positive pressure air channel via a positive-and-negative-pressure selective supply device 292 (see FIG. 9), and is constructed such that a free end of the each nozzle 142 applies a negative pressure to an electronic component so as to hold, by suction, the component, and applies a low positive pressure to the component so as to release the component. The mounting units 140 having a generally bar-like shape are held by an outer circumferential portion of a unit holding body 294 that is intermittently rotated, such that the mounting units 140 are equiangularly spaced from each other and an axial direction of each mounting unit 140 is vertical. Each of the mounting units 140 is rotatable about an axis line thereof, and is movable in the axial direction thereof. The unit holding body 294 is driven by a unit-holding-body rotating device 298 including, as a drive source thereof, a holding-body rotating motor 296 as a sort of electric motor (e.g., a servomotor with an encoder), such that the unit holding body 294 is intermittently rotated (also called "is indexed") at an angular pitch equal to an angular pitch at which the mounting units 140 are equiangularly spaced from each other and accordingly each of the mounting units 140 is intermittently revolved for indexing. At a unit elevating and lowering station as one of a plurality of stop positions where each of the mounting units 140 is stopped while being intermittently rotated, the each mounting unit 140 is elevated and lowered by a unit elevating and lowering device 302 including, as a drive source thereof, a unit elevating and lowering motor 300 as a sort of electric motor (e.g., a servomotor with an encoder). Thus, the each mounting unit 140 being positioned at the unit elevating and lowering station takes an electronic component from an appropriate one of the feeders 16, and mounts the component on the circuit substrate 86 held by the conveyor unit 20. To this end, the mounting unit 140 is lowered by a pre-determined distance. In addition, each mounting unit 140 is rotated about an axis line thereof by a unit rotating device 306 including, as a drive source thereof, a unit rotating motor 304 as a sort of electric motor (e.g., a servomotor with an encoder), for the purpose of, e.g., adjusting a rotation position at which the electronic component sucked and held by the each mounting unit 140 is mounted on the circuit substrate 86. The unit holding body 294 is constructed in such a manner that the plurality of mounting units 140 are simultaneously rotated about the respective axis lines thereof. Thus, the description of the general construction of the mounting head 21*a* ends.

The other mounting heads 21*b*, 21*c* have a construction similar to that of the mounting head 21*a*, but have the following differences: The mounting head 21c includes only one mounting unit 140, and does not include the unit-holding-body rotating device 298 employed by the mounting head 21a. The mounting head 21b include two mounting units 140 each one of which can be elevated and lowered independent of the other mounting head 140. Thus, the mounting head 21b employs two unit elevating and mounting devices, not shown, and one of the two mounting units 140 includes a nozzle selecting device, not shown, that selects an arbitrary one of a plurality of suction nozzles 142.

Figure 7:
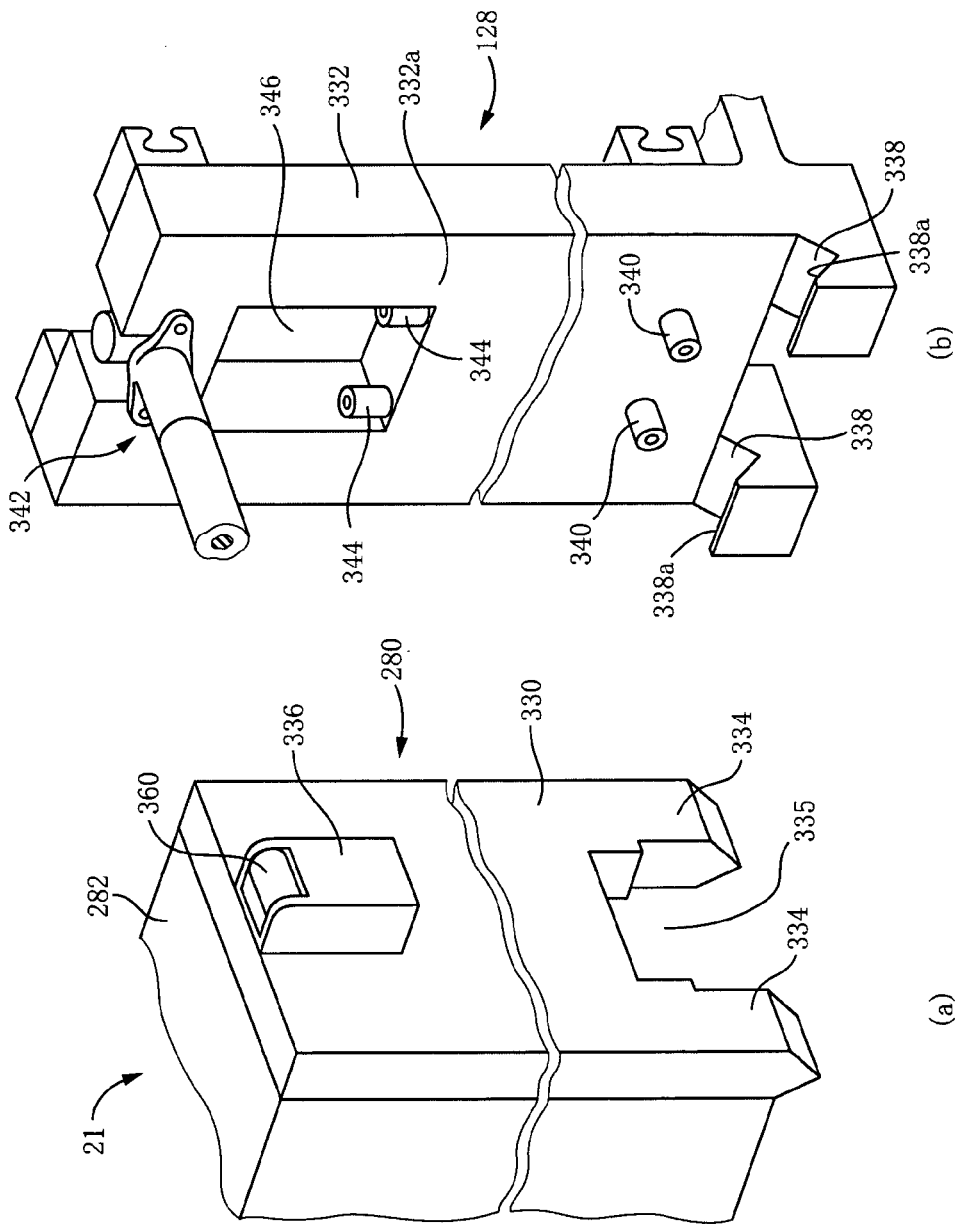
FIG. 7 shows perspective views for explaining an attaching device that attaches the mounting head to a head moving device.

As described above, the mounting head 21 is detachably attached to the X slide 128, whereby the head 21 is detachably attached to the head moving device 102. Hereinafter, there will be described an attaching device for detachably attaching the mounting head 21 to the head moving device 102. FIG. 7(a) is a perspective rear view of the mounting head 21; and FIG. 7(b) is a perspective front view of the X slide 128.

A rear portion 330 of the main body 280 of the mounting head 21 constitutes an attachment portion of the head 21; and a front portion 332 of the X slide 128 constitutes a support portion of the slide 128. The front portion 332 has a vertical front surface 332a extending in a vertical direction, as shown in FIGS. 2, 4, 6 and 7(b). The rear portion 330 of the main body 280 has, in a lower portion thereof, two leg portions 334, and has, in an upper portion thereof, an engaging block 336. Meanwhile, the front portion 332 of the X slide 128 has, in a lower portion thereof, two leg support portions 338 for supporting the two leg portions 334, respectively, and additionally has, in a portion thereof above the leg support portions 338, two lower engaging rollers 340. Each of the two leg support portions 338 extends substantially perpendicularly from the vertical front surface 332a of the front portion 332, as shown in FIG. 7(b). In addition, the front portion 332 of the X slide 128 has, in an upper portion thereof, a head fixing device 342 (see FIG. 4) that engages a portion of the engaging block 336 and thereby fixes the block 336, and additionally has, in a portion thereof below the head fixing device 342, an engaging hole 346 that has two upper engaging rollers 344 and receives the engaging block 336. In a state in which the mounting head 21 is attached to the X slide 128, the rear portion 330 of the main body 280 and the front portion 332 of the X slide 128 are held in close contact with each other.

Each of the two leg portions 334 has a wedge-like free end that can fit in a V-shaped groove of a corresponding one of the two leg support portions 338. The V-shaped groove of each of the leg support portions 338 has an inclined surface 338a facing toward the vertical front surface 332a of the front portion 332, as shown in FIG. 7(b). Thus, a position of the mounting head 21 in the vertical direction can be defined. In addition, two opposite inner surfaces of respective upper portions of the two leg portions 334 that are distant from each other by a distance smaller than that of respective lower portions of the same 334 cooperate with each other to define a space 335 to receive the two lower engaging rollers 340, as shown in FIGS. 7(a) and 7(b), and can closely engage respective outer circumferential surfaces of the two lower engaging rollers 340. Moreover, two side surfaces of the engaging block 336 can closely fit in a space between respective outer circumferential surfaces of the two upper engaging rollers 344. Thus, a position of the mounting head 21 in the left-and-right direction can be defined.

Figure 8:
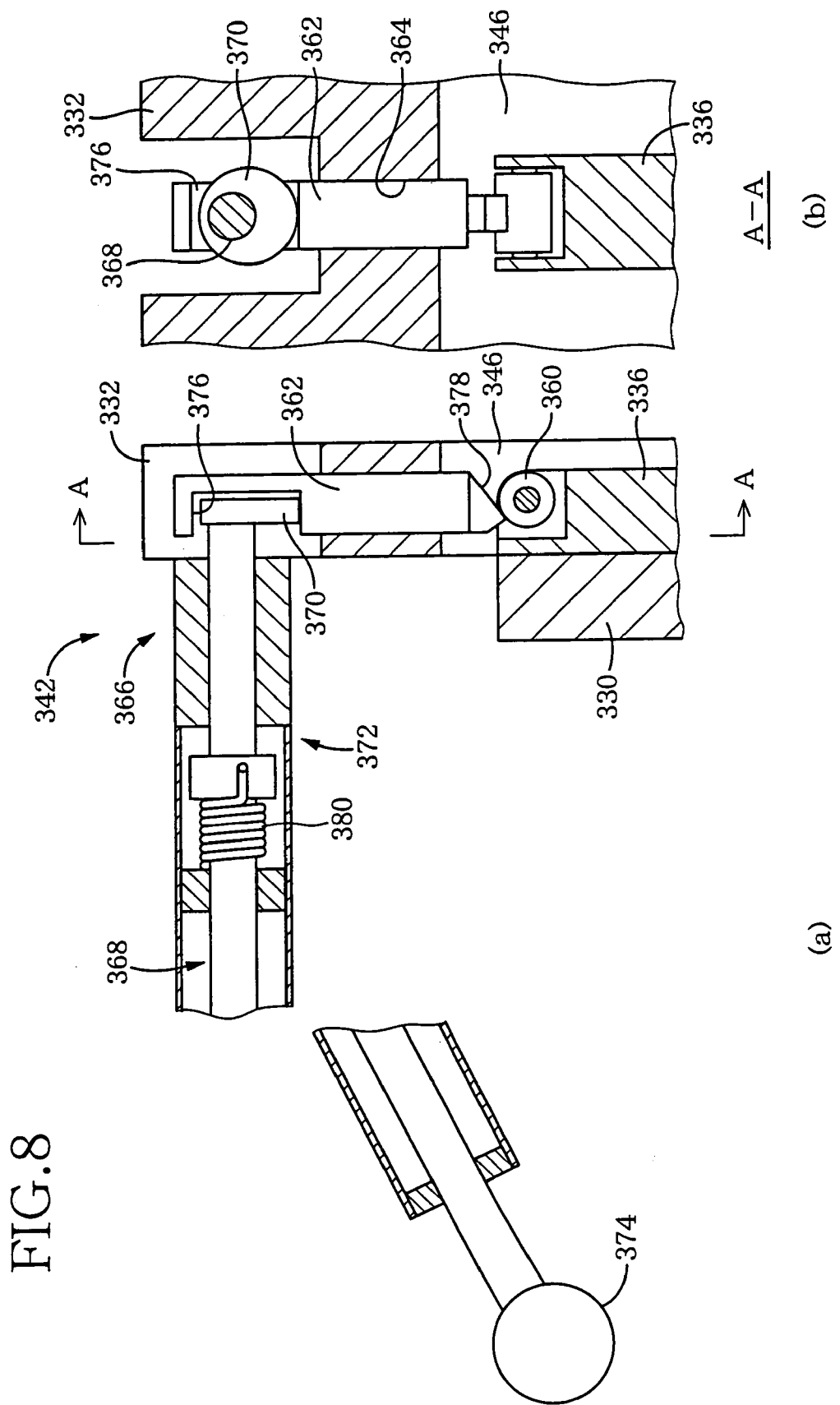
FIG. 8 shows cross-section views of a head fixing device that fixed the mounting head 21.

FIGS. 8(a) and 8(b) show two cross section views of the head fixing device 342, respectively. More specifically explained, FIG. 8(a) shows a cross-section view of the X slide 128, taken along a plane passing through a center of the same 128 in the left-and-right direction: and FIG. 8(b) is a cross-section view of the X slide 128, taken along A-A in FIG. 8(a).

The head fixing device 342 includes a latch pin 362 that can engage a latch roller 360 (see FIG. 7) provided in an upper portion of the engaging block 336. More specifically described, the latch pin 362 of the head fixing device 342 is supported by a pin support hole 364 provided in an upper portion of the front portion 332, such that the latch pin 362 is movable in the vertical direction, and the head fixing device 342 additionally includes a latch-pin operating device 366 that moves the latch pin 362 upward and downward. The latch-pin operating device 366 includes a rod 368 having a certain degree of flexibility; a disc-like cam plate 370 that is fixedly provided on one end of the rod 368 such that the cam plate 370 is eccentric with the rod 368; a generally tubular rod support member 372 that supports the rod 368 such that the rod 368 can be rotated about an axis line thereof, and a grip 374 that is fixedly provided on the other end of the rod 368 and is operable for rotating the rod 368. The rod support member 372 of the latch-pin operating device 366 is fixed to the upper portion of the front portion 332 of the X slide 128 (see FIG. 7). The latch pin 362 has, in an upper portion thereof, a groove 376 that has a width somewhat greater than an outer diameter of the cam plate 370, and engages the same 370. When the grip 374 is rotated, the latch pin 362 is moved upward and downward. For the purpose of easily operating the grip 374, the rod support member 372 of the latch-pin operating device 366 has a shape that is downwardly bent so that the grip 374 is positioned at a low position.

When the mounting head 21 is attached to the X slide 128, first, the grip 374 is rotated in one direction (e.g., counter-clockwise as seen from a front side of the grip 374, in the present embodiment), so that the latch pin 362 is moved upward. In this state, the rear portion 330 of the mounting head 21 is held in close contact with the front portion 332 of the X slide 128, and then the grip 374 is rotated in the opposite direction (e.g., clockwise as seen from the front side of the grip 374, in the present embodiment). Consequently the latch pin 362 is moved downward and, just before the pin 362 reaches the lowest position thereof, an inclined surface 378 formed in a lower end of the pin 362 engages an outer circumferential surface of the latch roller 360. When the grip 374 is further rotated in the same direction, the latch pin 362 latches the latch roller 360 by pressing, owing to the effect of the inclined surface 378, the mounting head 21 downward and rearward. Though this state can be kept by a frictional force that is produced between an outer circumferential surface of the cam plate 370 and a lower one of two opposite surfaces defining the groove 376, this state is assuredly kept by a torsion spring 380 that is employed by the latch-pin operating device 366 so as to bias the rod 368 in the direction to move the latch pin 362 downward. When the mounting head 21 is detached from the X slide 128, the grip 374 is rotated in the above-indicated one direction.

In the present embodiment, the operation performing module 12 can be used with an arbitrary one of various sorts of operation performing heads 21. However, the common attaching device is used to attach each of the various operation performing heads 21. Owing to the attaching device, each operation performing head 21 can be detached, in one step, from the X slide 128, and can be attached, in one step, to the same 128. The operation performing head 21, attached to the X slide 128, can be controlled by the module control device 26. To this end, respective electric-power lines and respective control-signal lines of the operation performing head 21 that are used to drive the respective constituent elements of the same 21 are connected to the head moving device 102. This connection can be carried out, in one step, by using connectors, not shown. The operation performing head 21 includes a memory chip 400 (see FIG. 5) as an individual-information recording medium that records individual information identifying the head 21 itself. The memory chip 400 can also be connected to the module control device 26. The memory chip 400 is a RAM chip that is backed up by a battery, and in which various sorts of information can be recorded. The information recorded in the memory chip 400 and the manner of use of the information will be described later.

<Factors of Operation Performing Head>

In the present embodiment, the mounting head 21 is a small-size operation performing head. In particular, a width of the mounting head 21 (i.e., a length of the same 21 in the substrate-feed direction (i.e., the X direction), in the state in which the head 21 is attached to the X slide 128, i.e., "x" in FIG. 4) is small, i.e., not more than 60 mm. Out of the above-described three sorts of mounting heads 21a, 21b, 21c, the mounting head 21a of the index type is used to mount considerably small circuit components. The mounting head 21a includes the suction nozzles 142 that are provided such that respective centers of the nozzles 142 are located on a circle whose diameter is not more than 40 mm. A width of the X slide 128 to which the mounting head 21 is attached is equal to that of the head 21. Though, in the present embodiment, the mark camera 132 as the substrate-image taking device is provided on not the mounting head 21, but the X slide 128, the mark camera 132 is located at a position aligned with the head 21 in a direction perpendicular to a widthwise direction of the slide 128 (i.e., the Y direction perpendicular to the direction of movement of the slide 128). This also contributes to decreasing the width of the X slide 128. In the present embodiment, a length of the mounting module 12 in the substrate-feed direction, i.e., a width of the each module 12 is considerably small. However, since the respective widths of the mounting head 21 and the X slide 128 are considerably small, the head 21 can mount circuit components in a considerably large range in a widthwise direction thereof.

Out of the three sorts of mounting heads 21a, 21b, 21c, the mounting head 21a of the index type has the greatest weight, e.g., about 2 kg. Since the mark camera 132 is separate from the mounting head 21, the weight of the head 21 is decreased as such. Meanwhile, a weight of the X slide 128 including the mark camera 132 is, e.g., about 2 kg. Thus, in the head moving device 102 as the X-Y robot type moving device, the X-slide device 114 moves, as an object to be moved, the mounting head 21 and the X slide 128 a weight of a combination of which is not more than 5 kg. Thus, a load applied to the head moving device 102 is considerably small. Therefore, the mounting head 21 can be moved at a high speed, and the mounting module 12 can enjoy a high productivity. In addition, since the mounting head 21 is light, the head 21 produces less vibration or consumes less energy.

<Control Device>

Figure 9:
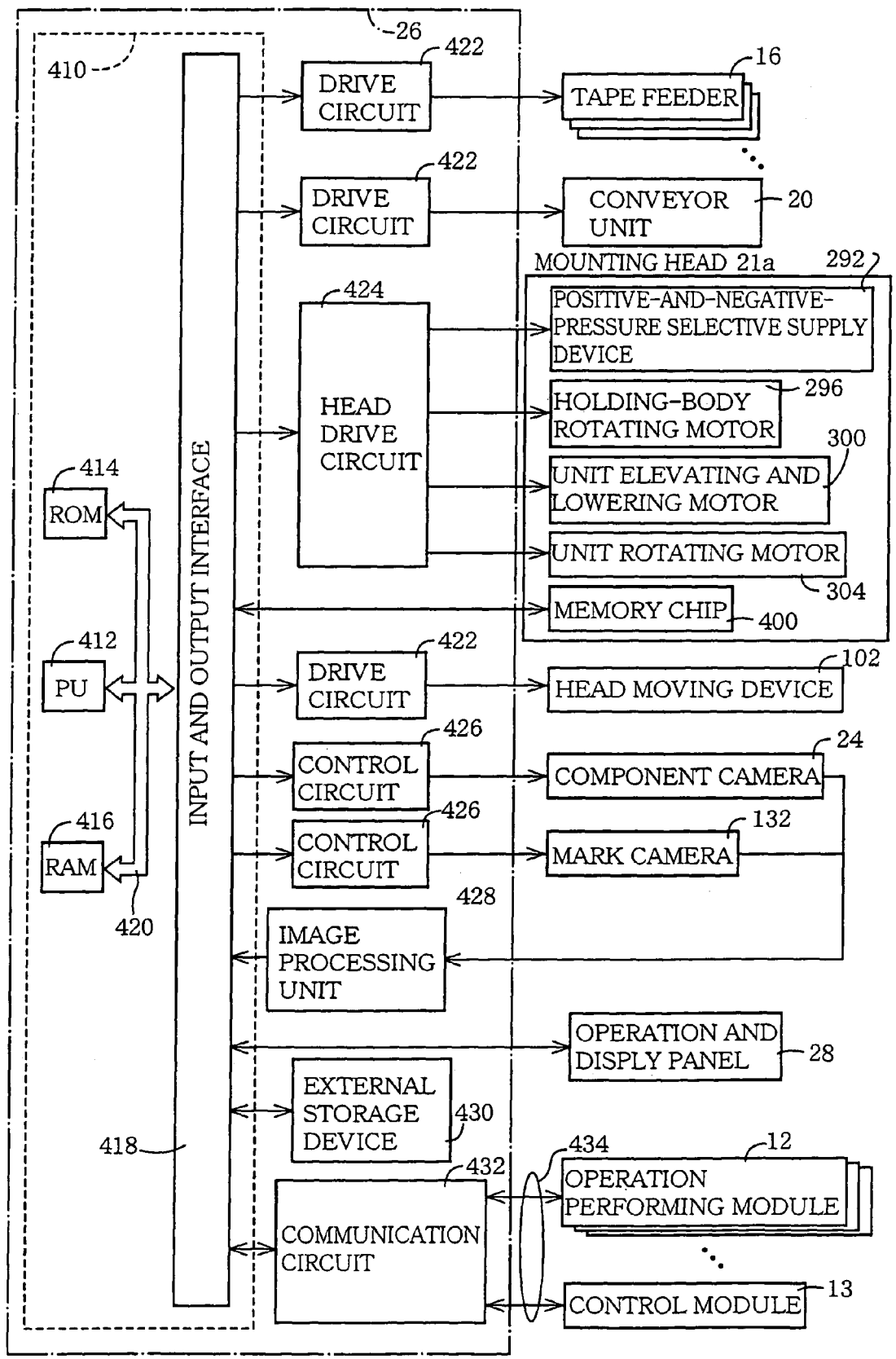
FIG. 9 is a diagrammatic view for explaining control functions of a module control device employed by each operation performing module.

The substrate related operation performing apparatus 1 is controlled by the respective module control devices 26 of the operation performing modules 12, and the control module 13 as the operation-performing-apparatus control device that controls the operation performing modules 12 in an integrated manner. However, an essential portion of the operation performed by each operation performing modules 12 is performed under control of the module control device 26 of the each module 12. FIG. 9 is a diagrammatic view of a relevant portion of the module control device 26 of each operation performing module 12.

The module control device 26 is essentially constituted by a computer 410 including a PU (processing unit) 412, a ROM 414, a RAM 416, an input and output interface 418, and a bus connecting those elements 412, 414, 416, 418 to each other.

The feeders 16 or the feeder group 18, the conveyor unit 20, and the head moving device 102 are connected to the input and output interface 418 via respective drive circuits 422. In addition, the module control device 26 includes a head drive circuit 424 that drives the operation performing head 21, and the head 21 is connected to the input and output interface 418 via the head drive circuit 424. In addition, the component camera 24 and the mark camera 132 are connected to the input and output interface 418 via respective control circuits 426, and image data indicating the image taken by each of the two cameras 24, 132 are sent to the input and output interface 418 via an image processing unit 428 after the image data are processed by the unit 428. The operation and display panel 28, and an external storage device 430 that is essentially constituted by a hard disc as a sort of memory are connected to the input and output interface 418. In the substrate related operation performing apparatus 1, all the operation performing modules 12 perform the respective operations while communicating various sorts of signals with each other. To this end, the other operation performing modules 12 are connected to the input and output interface 418 via a communication circuit 432. In addition, the control module 13 that functions like a host computer in relation with the module control devices 26 is also connected to the input and output interface 418 via the communication circuit 432, so that the input and output interface 418 can communicate signals, information, etc. with the control module 13. That is, the operation performing modules 12 and the control module 13 are connected to each other via a LAN 434. The external storage device 430 stores an operating system, various application programs such as a mounting program corresponding to each sort of circuit substrate, various sorts of data related to circuit components, etc. When a mounting operation is performed, necessary programs and data are sent from the external storage device 430 to the RAM 416 and are stored by the same 416, so that the mounting operation may be performed based on the programs and data stored by the RAM 416.

Next, the operation performing head 21 will be described in detail. The diagrammatic view of FIG. 9 shows that the mounting head 21a as the operation performing head 21 is attached to the operation performing module 12, such that the positive-and-negative-pressure selective supply device 292, the holding-body rotating motor 296, the unit elevating and lowering motor 300, and the unit rotating motor 304 are connected to the head drive circuit 424. Thus, depending upon the sorts of the operation performing heads 21 each attached to the operation performing module 12, different sorts of actuators, drive sources, etc. may be connected to the head drive circuit 424. The various devices belonging to the operation performing head 21, such as the feeders 16 or the conveyor unit 20, are driven by respective exclusive "drivers", i.e., software programs used to operate those devices. The drivers correspond to respective constructions of those devices. The operation performing head 21 is driven by an operation-performing-head driver and, for example, the mounting head 21a is driven by an exclusive mounting-head driver. The various sorts of drivers are stored by a driver storage portion as a portion of the external storage device 430. For example, when the mounting head 21a is attached to the operation performing module 12, the module control device 26 reads, from the external storage device 430, the exclusive head driver corresponding to the mounting head 21a, and transmits the head driver to the RAM 416, so as to build an operating program corresponding to the mounting head 21a. In addition, the memory chip 400 of the operation performing head 21 is connected to the input and output interface 418, so that the computer 410 can communicate information with the head 21.

Though not shown, the control module 13 as the operation-performing-apparatus control device is essentially constituted by a computer including a PU, a ROM, a RAM, and an input and output interface, and additionally includes an external storage device, an input device such as a keyboard, an output device such as a display, etc. The control module 13 can communicate various sorts of signals and data with each of the operation performing modules 12, and controls all the operation performing modules 12 in an integrated manner. In addition, control module 13 functions as a data base that stores various sorts of data that are needed by the substrate related operation performing apparatus 1. The respective mounting programs corresponding to the operation performing modules 12 are supplied from the control module 13. Moreover, the control module 13 can enable the substrate related operation performing apparatus 1 to communicate with external devices.

Figure 10:
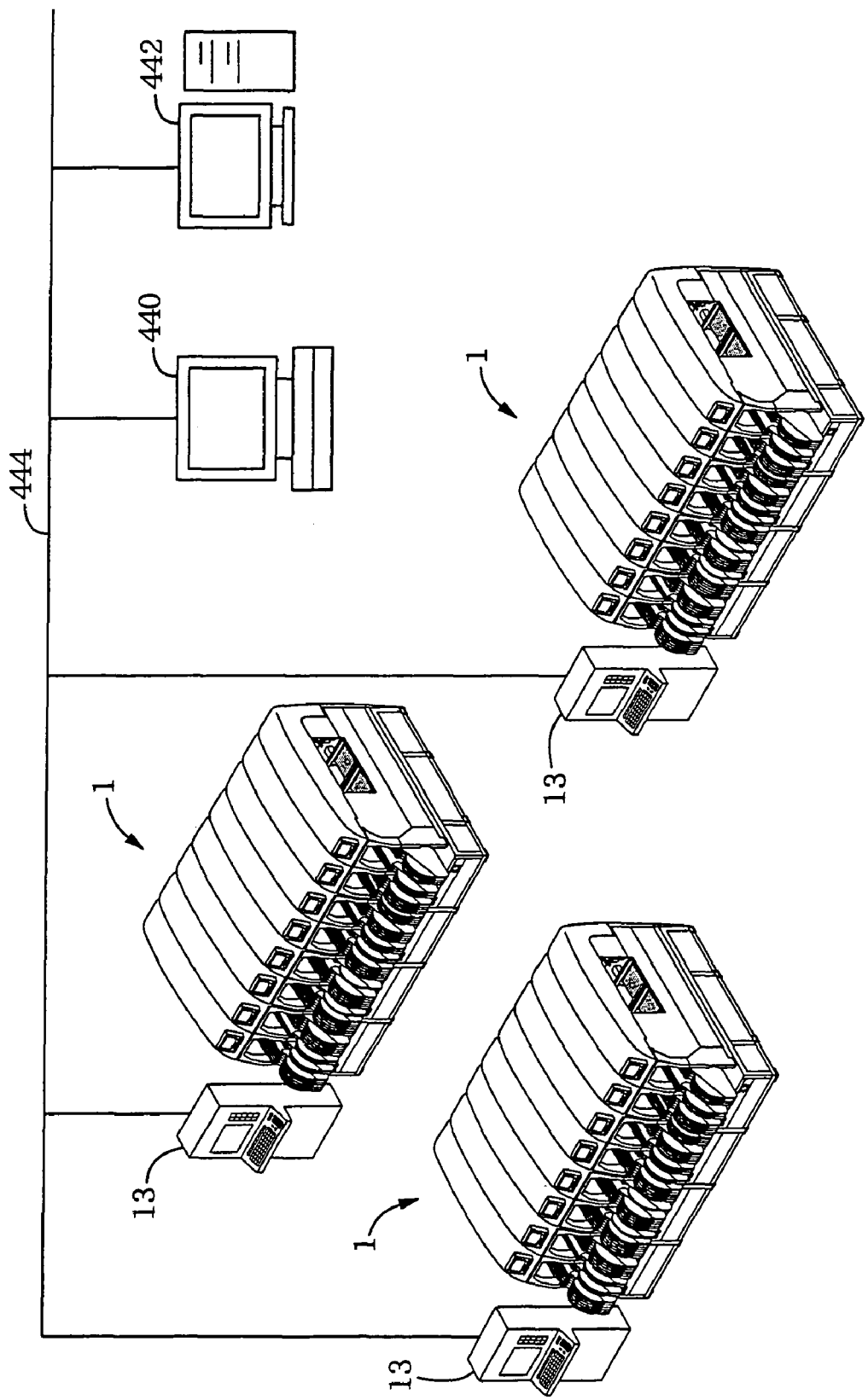
FIG. 10 is a schematic view for explaining a manner in which substrate-related-operation performing apparatuses are disposed in a factory.

FIG. 10 schematically shows a manner in which a plurality of substrate related operation performing apparatuses 1 are disposed in a factory. More specifically described, three substrate related operation performing apparatuses 1 of a same type are provided. The three apparatuses 1 are connected to each other such that they can transmit, and receive, information to, and from, each other, and each of the apparatuses 1 is connected to various sorts of management computers (two management computers 440, 442 are shown in the figure), so as to transmit, and receive, information to, and from, each other. The substrate related operation performing apparatuses 1 and the management computers 440, 442 are connected to each other via a LAN 444. There are various sorts of management computers such as one functioning as a data base that stores various operation performing programs corresponding to various sorts of circuit substrates, or one functioning as a data base that stores data representing factors of each sort of circuit substrate. Out of those management computers, FIG. 10 shows a production-history management computer 440 functioning as a data base that stores data related to a production history of each substrate related operation performing apparatus 1, and a module-device management computer 442 functioning as a data base that stores information related to the module's devices such as the operation performing heads 21 or the feeders 16. When the operation performing heads 21 are replaced with each other, each of the two management computers 440, 442 functions as a head-related-information external storage portion that stores, outside each substrate related operation performing apparatus 1, head-related information that is related to each of the operation performing heads 21. Information representing how each substrate related operation performing apparatus 1 has performed production operations is sent to the production history management computer 440, and the thus sent information contains information indicating what sorts of operation performing heads 21 have been used in the production operations. In addition, information related to results of inspection of circuit substrates on which operations have been performed, is also sent to the production-history management computer 440, and the management computer 440 manages, as one of production history parameters, a failure rate with respect to each of the operation performing heads 21. The production history management computer 440 and the module-device management computer 442 will be described in detail, later.

<Component Mounting Operation>

Next, there will be briefly described a component mounting operation that is performed by one mounting module 12 to which the mounting head 21a is detachably attached. A circuit substrate 86 that is fed from the upstream side is stopped, by the conveyor unit 20, at the operation performing position pre-determined in the operation performing area. The circuit substrate 86, stopped at the operation performing position, is fixed and held there by the conveyor unit 20, since the circuit-substrate support plate 90 is elevated by the elevating and lowering device. Subsequently, the head moving device 102 moves the mark camera 132 to positions above the fiducial marks affixed to the circuit substrate 86, so that the mark camera 132 takes respective images of the fiducial marks. Based on image data representing the thus taken images, positional errors of the circuit substrate 86 held by the conveyor unit 20 are determined.

Then, the mounting head 21a is moved to a position above the feeder group 18, and the suction nozzles 142 of the head 21a hold, by suction, respective circuit components in a pre-determined sequence. More specifically described, the mounting unit 140 that is currently positioned at the unit elevating and lowering station is moved to a position above the component supply position on the feeder 16 so as to supply a circuit component to be taken by that unit 140 and, at that position, the unit 140 is lowered while a negative pressure is supplied to the suction nozzle 142 held by the lower end of the unit 140. Thus, the mounting unit 140 holds, by suction, the circuit component. After the mounting units 140 are intermittently revolved, the following mounting unit 140 carries out a similar component taking action. Thus, the mounting units 140 of the mounting head 21a sequentially carry out respective component taking actions (eight actions in total, in each of normal mounting operations).

Then, the mounting head 21a holding the circuit components are moved to a position above the component camera 24. At that position, the component camera 24 takes, at once, an image of all the circuit components, held by the head 21a, that fall in a field of view of the camera 24. Based on image data representing the taken image, respective errors of the circuit components held by the head 21a are determined. Subsequently, the mounting head 21a is moved to above the circuit substrate 86, and sequentially mounts, in a predetermined sequence, the circuit components held thereby, on a surface of the circuit substrate 86. More specifically described, the mounting unit 140 that is currently positioned at the unit elevating and lowering station is moved to a position above an appropriate component-mount position on the circuit substrate 86. To this end, based on the respective determined amounts of positional errors of the circuit substrate 86 and the respective determined amounts of positional errors of the circuit component held by the mounting unit 140, amounts of movement of the mounting head 21a are adjusted. At the above-indicated position, the mounting unit 140 is lowered by a predetermined distance, while a positive pressure is supplied to the suction nozzle 142. Thus, the circuit component held by the nozzle 142 is mounted on the surface of the circuit substrate 86. After the mounting units 140 are intermittently revolved, the following mounting unit 140 carries out a similar component mounting action. Thus, the mounting units 140 of the mounting head 21a sequentially carry out respective component mounting actions. However, before each mounting unit 140 is lowered in the component mounting action, the mounting unit 140 is rotated to an appropriate rotation position, about the axis line thereof, based on a predetermined rotation position at which the circuit component held thereby is to be mounted on the circuit substrate 86, the detected amounts of positional errors of the circuit substrate 86, and the detected amounts of positional errors of the circuit component. Thus, the circuit component adjusted to the appropriate rotation position is mounted on the circuit substrate 86.

Till all circuit components pre-programmed to be mounted have been actually mounted, the mounting head 21 is reciprocated between the feeder group 18 and the circuit substrate 86, while repeating the component taking actions and the component mounting actions. After all the circuit components have been mounted, the support plate 90 of the conveyor unit 20 is lowered by the elevating and lowering device, so that the circuit substrate 86 is released from the fixed and held state thereof. Then, the circuit substrate 86 is fed toward the downstream side by the conveyor unit 20. Thus, the mounting module 12 finishes the component mounting operation that is pre-programmed to be performed on the circuit substrate 86.

In the component mounting apparatus 1 including the plurality of mounting modules 12, when all the mounting modules 12 finish their respective component mounting operations on the circuit substrate 86, the component mounting apparatus 1 finishes its component mounting operation on the same 86. Thus, the component mounting apparatus 1 mounts circuit components on circuit substrates, while the circuit substrates are fed, one after another, from the upstream side toward the downstream side, through the individual mounting modules 12, and the individual mounting modules 12 sequentially perform the respective pre-programmed mounting operations on each of the circuit substrates. More specifically described, the circuit substrates are carried, one after another, into the upstream-side mounting modules 12, so that the mounting modules 12 mount the circuit components on the circuit substrates; and the circuit substrates are carried, one after another, out of the downstream-side mounting modules 12, after the mounting modules 12 have mounted the circuit components on the circuit substrates. The carrying-in operation to carry the circuit substrates into the component mounting apparatus 1, and the carrying-out operation to carry the circuit substrates out of the component mounting apparatus 1 may be performed by a carry-in device and a carry-out device that are provided in the vicinity of the most upstream mounting module 12 and the most downstream mounting module 12, respectively, and each of which is essentially constituted by a conveyor device.

<Preparing Steps Related to Attachment of Operation Performing Head>

As described above, each of the operation performing modules 12 can be used with an arbitrary one of the plurality of operation performing heads 21. When one operation performing head 21 is initially attached to one operation performing module 12, the particular module 12 carries out preparing steps to use the particular head 21. Hereinafter, there will be described preparing steps related to attachment of operation performing head 21, for example, with respect to the case where the mounting head 21*a* is attached.

Figure 11:
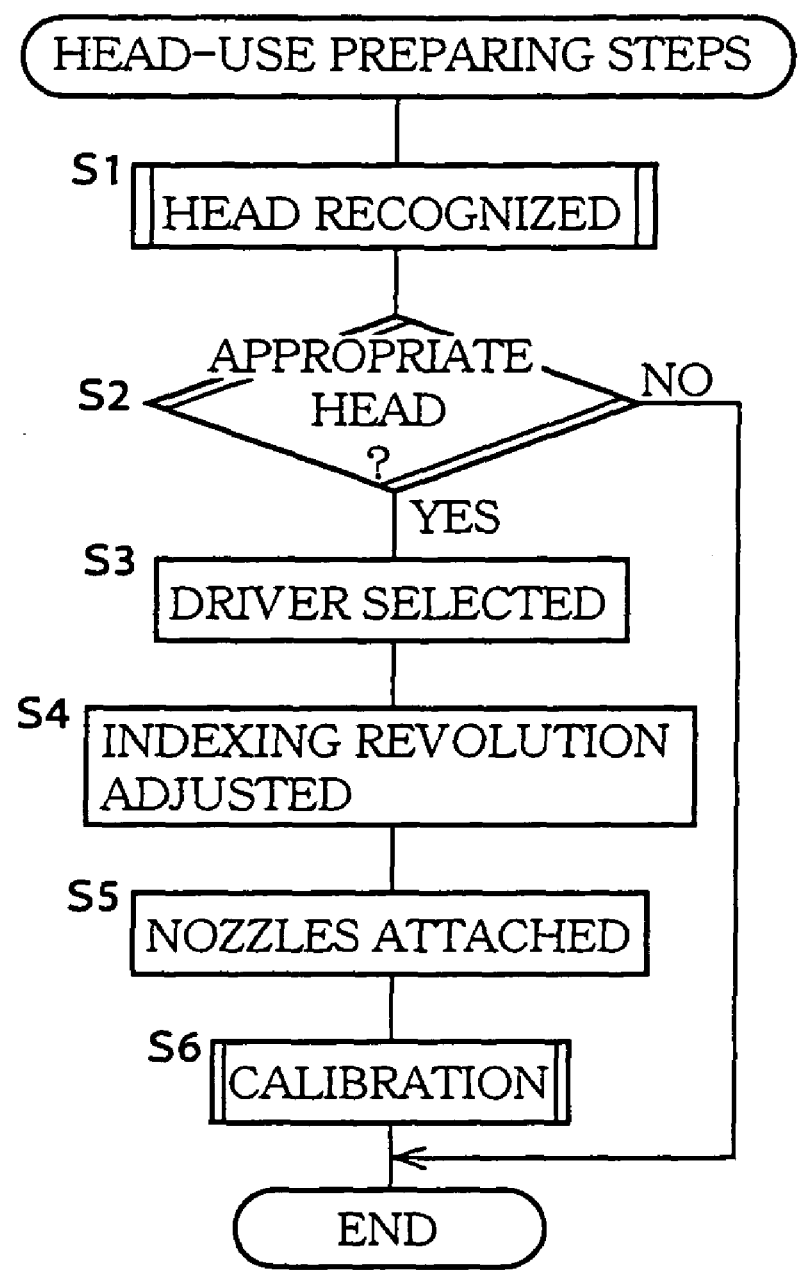
FIG. 11 is a flow chart representing a head-use preparing program that is implemented when an operation performing head is attached.

The preparing steps related to the attachment of mounting head 21*a* are controlled by the module control device 26 of the operation performing module 12 to which the mounting head 21*a* is attached. More specifically described, a head-use preparing program stored by the ROM 414 of the module control device 26 is implemented by the computer 410. FIG. 11 shows a flow chart representing the head-use preparing program. The preparing steps will be described below by reference to the flow chart. After the mounting head 21*a* is attached, first, at Step S1, the mounting head 21*a* is recognized. More specifically described, head-related information such as head-construction-related-factor information representative of factors related to the construction of the mounting head 21*a*, or head-status information representative of a status of the head 21*a* is recognized, and accordingly how the head 21*a* is constructed or in what status the head 21*a* is can be recognized. Step S1 is followed by Step S2 to judge, based on the recognized head-related information, whether the use of the mounting head 21*a* is appropriate. If it is judged that the use is not appropriate, an operator is informed of that fact, and the preparing steps are quitted. On the other hand, if it is judged that the use is appropriate, the control of the computer 410 goes to Step S3 to select an operation-performing-head driver that is suitable for the mounting head 21*a*, and thereby enable the head 21*a* to operate. Step S3 is followed by Step S4 to carry out, based on the recognized head-construction-related-factor information, adjustments related to the indexing revolving of the mounting units 140. Step S4 is followed by Step S5 where appropriate suction nozzles 142 are attached to the respective ends of the mounting units 140. After the suction nozzles 142 are attached, the control goes to Step S6 to carry out calibration. In short, this calibration is to address errors of attachment of the mounting head 21*a*, that is, adjust and fix the positions to be taken by the mounting head 21*a* during its operation, more specifically described, the command values representing those positions. In the above-explained manner, the head-use preparing steps are carried out. Hereinafter, there will be described each of the preparing steps, in detail.

i) Recognition of Head-Related Information

Figure 12:
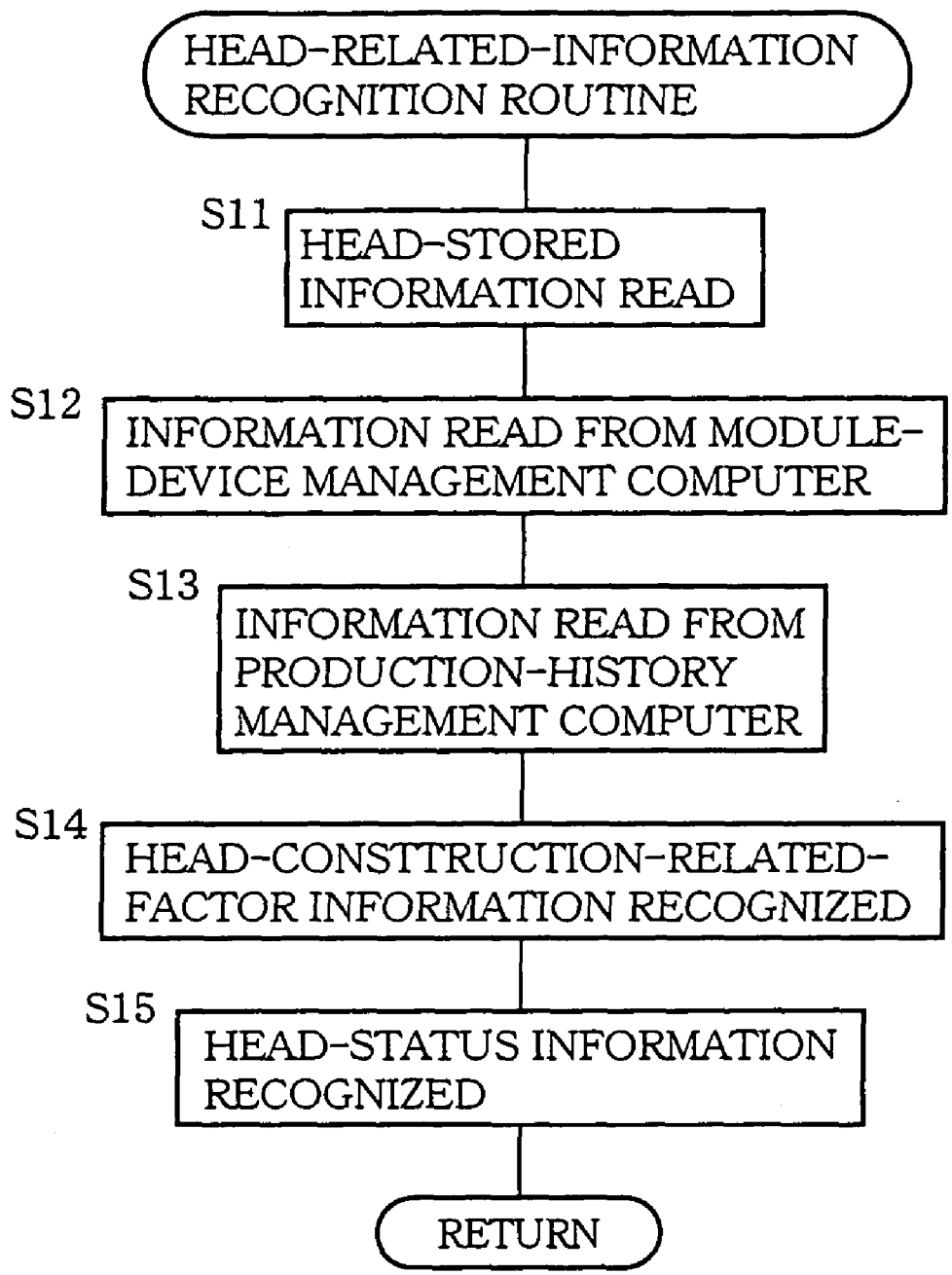
FIG. 12 is a flow chart representing a head-related-information recognition routine as a portion of the head-use preparing program.

Step S1, i.e., the head-related-information recognizing step is carried out according to a head-related-information recognition routine represented by a flow chart shown in FIG. 12. First, at Step S11, head-stored information that is stored by the memory chip 400 of the mounting head 21*a* is read. Thus, Step S11 is an individual-information reading step. The head-stored information is individual information related to the mounting head 21*a*, and includes head ID data representing an ID (identification) of the head 21*a*; and data representing factors related to the construction of the head 21*a*, such as head type data representing a type of the head 21*a*, pitch data representing an angular pitch at which the mounting units 140 of the head 21*a* are provided (hereinafter, referred to as the "unit-provision angle data", where appropriate), or data representing a height position of a nozzle holding portion of each of the mounting units 140 relative to a reference position (hereinafter, referred to as the "unit-height position data", where appropriate). The unit-provision angle data or the unit-height position data are a sort of information related to a position where a constituent element of the mounting head 21*a* is provided.

Subsequently, at Step S12, the computer 410 reads, from the above-described module-device management computer 442, data related to the mounting head 21*a*, based on the head ID data read at Step S11. The module-device management computer 442 stores a data base including various sorts of information related to various sorts of devices and tools that are present in the factory. The read head ID data are sent via the control module 13 to the module-device management computer 442. The management computer 442 searches, using the head ID data as a key, for information related to the mounting head 21*a*, and sends the thus obtained information via the control module 13 to the module control device 26. Thus, the necessary information is read from the management computer 442. The information read from the management computer 442 includes the head-construction-related-factor information such as the unit-provision angle data and the unit-height position data. The management computer 442 additionally stores information related to maintenance of various devices and tools, such that the information is related to the head ID data. More specifically described, the maintenance-related information includes data related to date and time when the last maintenance was carried out, data related to a cumulative operation time of each device or tool after the last maintenance (hereinafter, referred to as the "after-maintenance operation time", where appropriate), etc. Thus, at Step S12, the after-maintenance operation time of the mounting head 21a attached is read as a sort of head-status information.

Subsequently, at Step S13, the computer 410 reads, from the above-described production history management computer 440, the data related to the mounting head 21a, based on the head ID data read at Step S11. The production history management computer 440 stores a data base including respective batches of production history information representing respective production history of the various sorts of substrate-related-operation performing apparatuses present in the factory. Each batch of production history information includes data representing a failure rate. At Step S13, the module control device 26 sends the above-indicated head ID data identifying the mounting head 21a, and module ID data identifying the mounting module 12 to which the head 21a is attached, to the production history management computer 440 via the control module 13. Using the head ID data as a key, the management computer 440 produces, based on the information stored thereby, data representing a failure rate of the mounting head 21a with respect to a pre-determined time duration prior to the current time (hereinafter, referred to as the "predetermined-time-duration failure rate", where appropriate). In addition, using the head ID data and the module ID data as keys, the management computer 440 produces data representing a failure rate of the mounting head 21a in the pre-determined time duration in the state in which the head 21a is attached to the particular mounting module 12, i.e., a module-related predetermined-time-duration failure rate. Then, the management computer 440 sends the thus produced data representing the predetermined-time-duration failure rate and the module-related predetermined-time-duration failure rate, each regarding the mounting head 21a, to the module control device 26 via the control module 13. Thus, at Step S13, the module control device 26 obtains the predetermined-time-duration failure rate information and the module-related predetermined-time-duration failure rate information each as a sort of head-status information.

Subsequently, at Step S14, the computer 410 recognizes, from the information read at Steps S11 and S12, information representing factors related to the construction of the mounting head 21a. More specifically described, first, the computer 410 compares the unit-provision angle data and the unit-height position data read from the memory chip 400, with the unit-provision angle data and the unit-height position data read from the module-device management computer 442, and judges whether those data agree with each other. If, in a state in which the mounting head 21a is detached from the mounting module 12, the head 21a is subjected to adjustment and/or maintenance, those data stored by the memory chip 400 of the head 21a may be updated. Therefore, if a negative judgment is made at Step S14, the data stored by the memory chip 400 are used to replace the data stored by the module-device management computer 442. If a positive judgment is made at Step S14, the computer 410 stores the unit provision angle data and the unit height position data, together with the head type data, etc, in a head-construction-related-factor-information storage portion as a portion of the RAM 416. Subsequently, the computer 410 recognizes, from the information read at Steps S11, S12, and S13, information representing a status of the mounting head 21a. More specifically described, the computer 410 stores the after-maintenance operation time data read at Step S12, and the predetermined-time-duration failure rate data and the module-related predetermined-time-duration failure rate data each read at Step S13, in a head-status information storage portion as a different portion of the RAM 416. Thus, the recognition of the head status information is finished.

ii) Judgement About Whether Head is Appropriate

Figure 13:
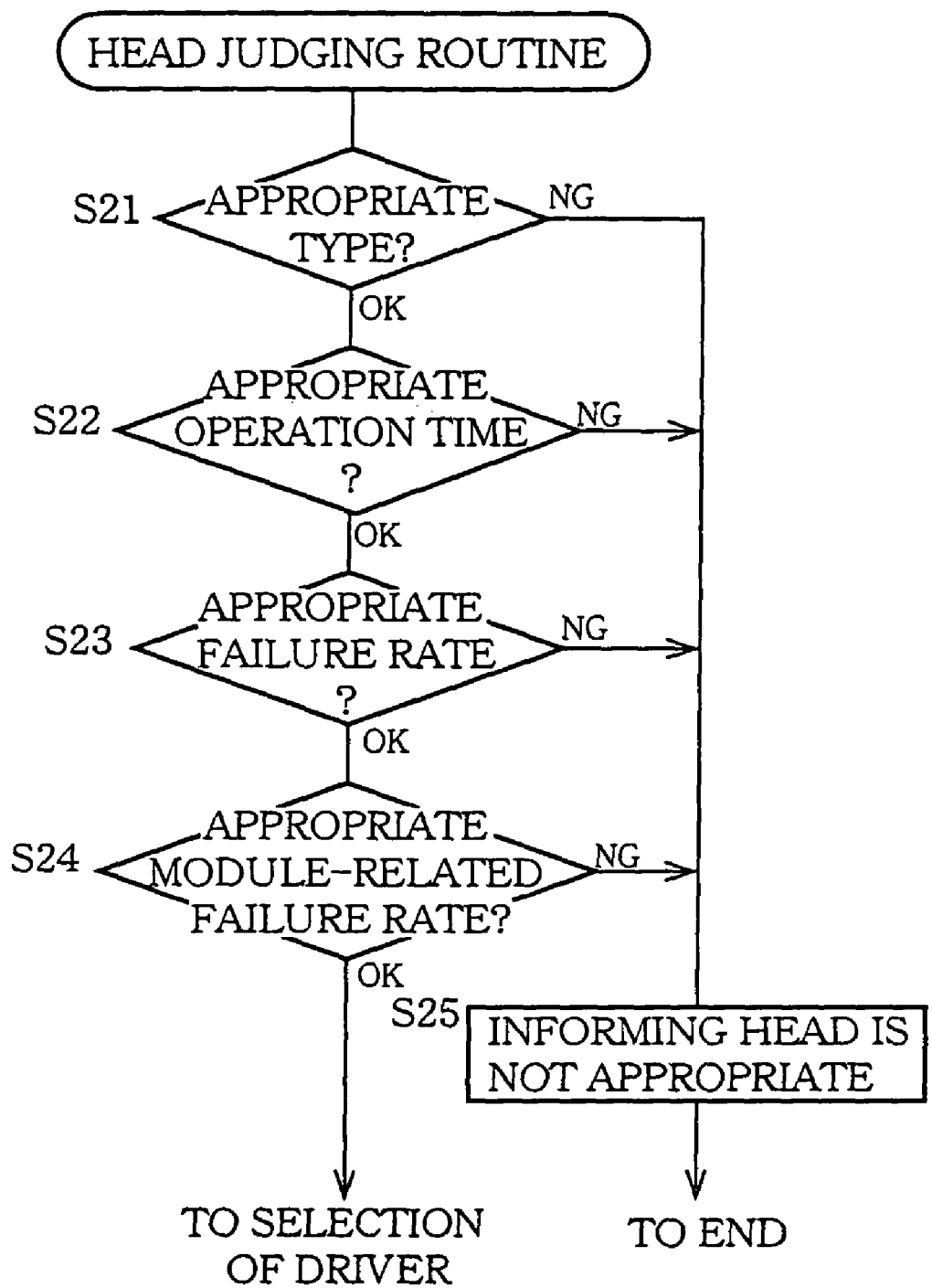
FIG. 13 is a flow chart representing a head judging routine as a portion of the head-use preparing program.

Step S2, i.e., the step of judging whether the head is appropriate is carried out according to a head judgment routine represented by the flow chart of FIG. 13. First, at Step S21, the computer 410 makes a judgment based on a head type. In the module control device 26, the RAM 416 stores, in a mounting-program storage portion thereof, a mounting program that is used when the mounting module 12 performs a mounting operation. At Step S21, the computer 410 compares the stored head type data with the contents of the mounting program, and thereby judges whether the type of the mounting head 21a attached to the mounting module 12 is appropriate for the mounting operation according to the mounting program. If a positive judgment is made, the control of the computer 410 goes to Step S22 to make a judgment based on the after-maintenance operation time of the mounting head 21a. More specifically described, if the stored after-maintenance operation time is more than a reference use limit time, the computer 410 judges that the mounting head 21a needs maintenance, and accordingly judges that the head 21a is not appropriate, so as to stop a further use of the head 21a. On the other hand, if the after-maintenance operation time is not more than the reference use limit time, the computer 410 judges that the mounting head 21a is appropriate, and allows a further use of the head 21a.

If a positive judgment is made at Step S22, the control goes to Step S23 to make a judgment based on the predetermined-time-duration failure rate. More specifically described, if the stored predetermined-time-duration failure rate is more than a reference limit failure rate corresponding to the particular sort of circuit substrates to be used, the computer 410 judges that the mounting head 21a is not appropriate. If a positive judgment is made at Step S23, the control goes to Step S24 to make a judgment based on the module-related predetermined-time-duration failure rate. It can be said that this judgment is made to judge whether the particular operation performing module 12 and the particular operation performing head 21 are compatible with each other. Like at Step S23, if the stored module-related predetermined-time-duration failure rate is more than the reference limit failure rate corresponding to the particular sort of circuit substrates to be used, the computer 410 judges that the mounting head 21a is not appropriate. The judgment at each of Steps S23 and S24 is made using the reference limit failure rate that is pre-set for the particular sort of circuit substrates to be used in the mounting operation and is proper to those substrates. For example, in the case where a mounting operation needs to be performed with high accuracy, a low limit failure rate is pre-set. The reference limit failure rate is described as a portion of the mounting program, and is read from the mounting program, i.e., data representing the program.

If a positive judgment is made at Step S24, the control goes to Step S3. On the other hand, if a negative judgment is made at any of Steps S21, S22, S23, and S24, the control goes to Step S25 to inform the operator of the fact that the mounting head 21a is not appropriate. More specifically described, the computer 410 controls the operation and display panel 28 to display the fact that the mounting head 21a is not appropriate, and a reason for the fact. After the fact is informed, the head-use preparing program is quitted. In response to what is displayed by the panel 28, the operator can remove the mounting head 21a and attach another mounting head 21a.

iii) Selection of Driver, Adjustment of Indexing Revolution, and Attachment Of Nozzle At Step S3, a driver is selected. As previously explained, the external storage device 430 stores various sorts of drivers corresponding to the various sorts of operation performing heads 21. At Step S3, the computer 410 selects, based on the recognized type of the mounting head 21a attached to the mounting module 12, one of the stored drivers that corresponds to the recognized type, and sends the selected driver to the RAM 416, so that the selected driver is stored in the driver storage portion of the RAM 416 and an operation performing program corresponding to the mounting head 21a is built in an operation-performing-program area of the RAM 416. Thus, the computer 410 becomes able to control the operation of the mounting head 21a.

After the driver is selected, the control goes to Step S4 to carry out adjustments about the indexing revolving of the mounting units 140. First, one of the mounting units 140 that is pre-selected as a reference unit is positioned at a designed angular position of the unit elevating and lowering station. In this state, the unit holding body 294 is stopped at an angular position, i.e., a rotation stop position for the reference unit to stop at the unit elevating and lowering station. Subsequently, based on the recognized unit-provision angle data, the unit holding body 294 is rotated for indexing, so that the other mounting units 140 are sequentially positioned at the unit elevating and lowering station. In the state in which each of the other mounting units 140 is stopped at the unit elevating and lowering station, a rotation stop position at which the unit holding body 294 is stopped is detected, and the thus detected rotation stop position is stored in a holding-body-rotation-stop-position storage portion of the RAM 416. From that time on, when each of the mounting heads 140 is stopped at the unit elevating and lowering station, the rotation of the unit holding body 294 is stopped at a corresponding one of the stored rotation stop positions. Those adjustments of rotation stop positions for indexing are carried out for preventing a manufacturing error of each of individual mounting heads 21 from adversely influencing the accuracy of mounting operation to be performed by the each head 21, and they are an example of the adjustments of operation performing positions of the mounting head 21a based on the head-construction-related-factor information. In addition, the adjustments of rotation stop positions for indexing can be said as a sort of calibration step.

Subsequently, at Step S5, the suction nozzles 142 are attached to the mounting units 140 of the mounting head 21a, respectively. The suction nozzles 142 to be used with the mounting head 21a are described in a portion of the mounting program, and the suction nozzles 142 to be attached to the head 21a are determined according to the mounting program. After this determination, the mounting head 21a is moved to a position above the previously-described nozzle stocker 25, and the mounting units 140 are sequentially lowered and elevated while the unit holding body 294 is intermittently rotated, i.e., indexed. Thus, the suction nozzles 142 accommodated at respective pre-determined positions in the nozzle stocker 25 are attached to the mounting units 140, respectively. The suction nozzles 142 can be identified from each other by respective nozzle ID data. Thus, at Step S5, the nozzle ID data identifying the suction nozzle 142 attached to each of the mounting units 140 are stored in an attached-nozzle-information storage portion of the RAM 416. In addition, length data (described later) representing a length of the suction nozzle 142 attached to the each mounting unit 140 is stored such that the length data are associated with the nozzle ID data identifying the suction nozzle 142.

iv) Calibration

Figure 14:
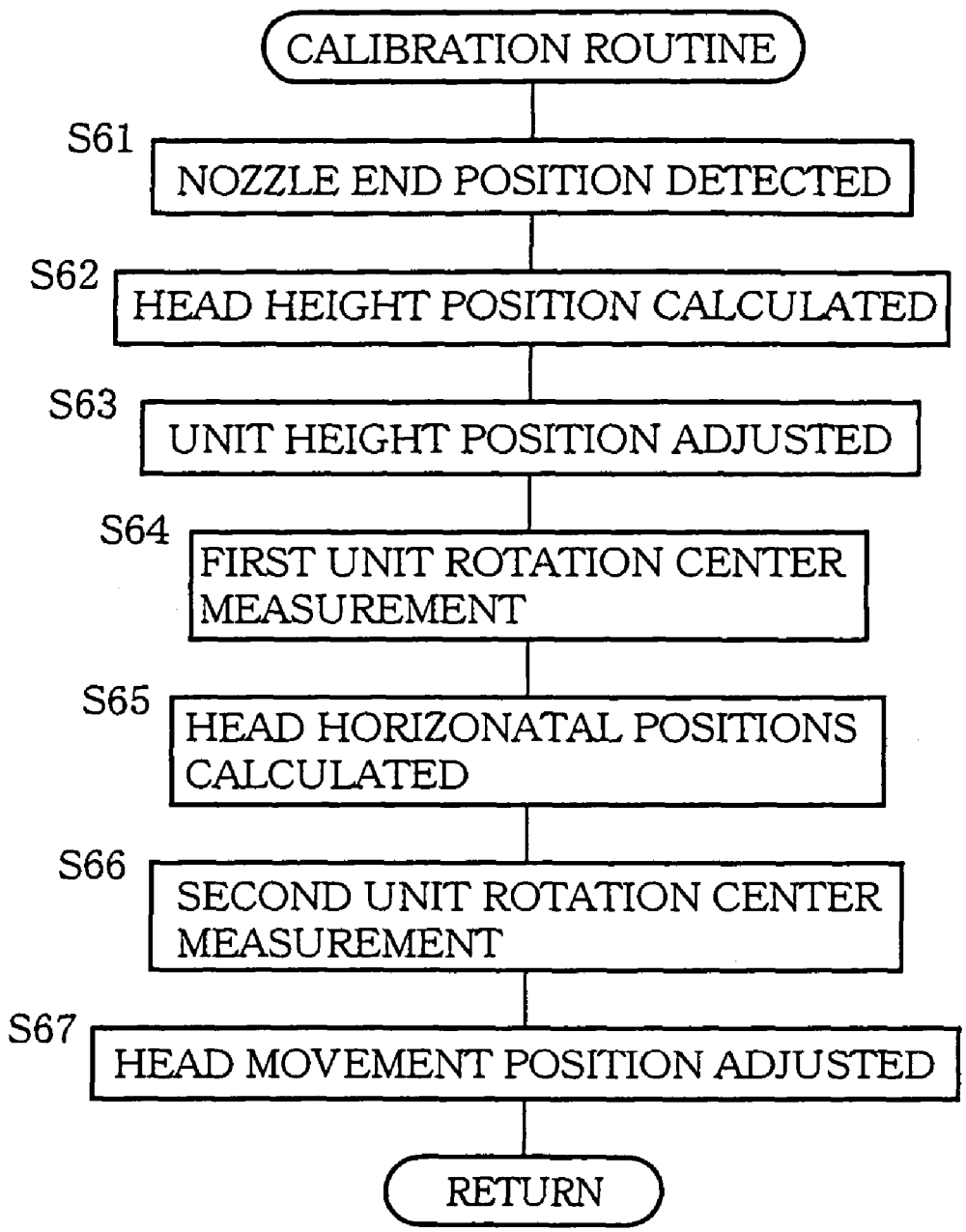
FIG. 14 is a flow chart representing a calibration routine as a portion of the head-use preparing program.

Step S6, i.e., the calibration step is carried out according to a calibration routine represented by the flow chart of FIG. 14. First, at Step S61, a height position of the lower end of the suction nozzle 142 attached to the above-described reference unit as one of the mounting units 140, is detected by the nozzle-end-height detector 27. To this end, in the state in which the reference unit is positioned at the unit elevating and lowering position, the mounting head 21a is moved to a position where the reference unit is positioned above the detector 27. Subsequently, the reference unit is slowly lowered. An upper surface of the nozzle-end-height detector 27 is used as a reference height position for the mounting module 12. The detector 27 is adapted to detect a state in which the lower end of the suction nozzle 142 contacts the upper surface of the detector 27. When the reference unit is lowered till the lower end of the suction nozzle 142 reaches the reference height position, the computer 410 measures a stroke of downward movement of the reference unit from an upper, start height position. Thus, in the present step, the measured stroke of downward movement of the reference unit is used as a detected value of the height position of the lower end of the suction nozzle 142.

Figure 15:
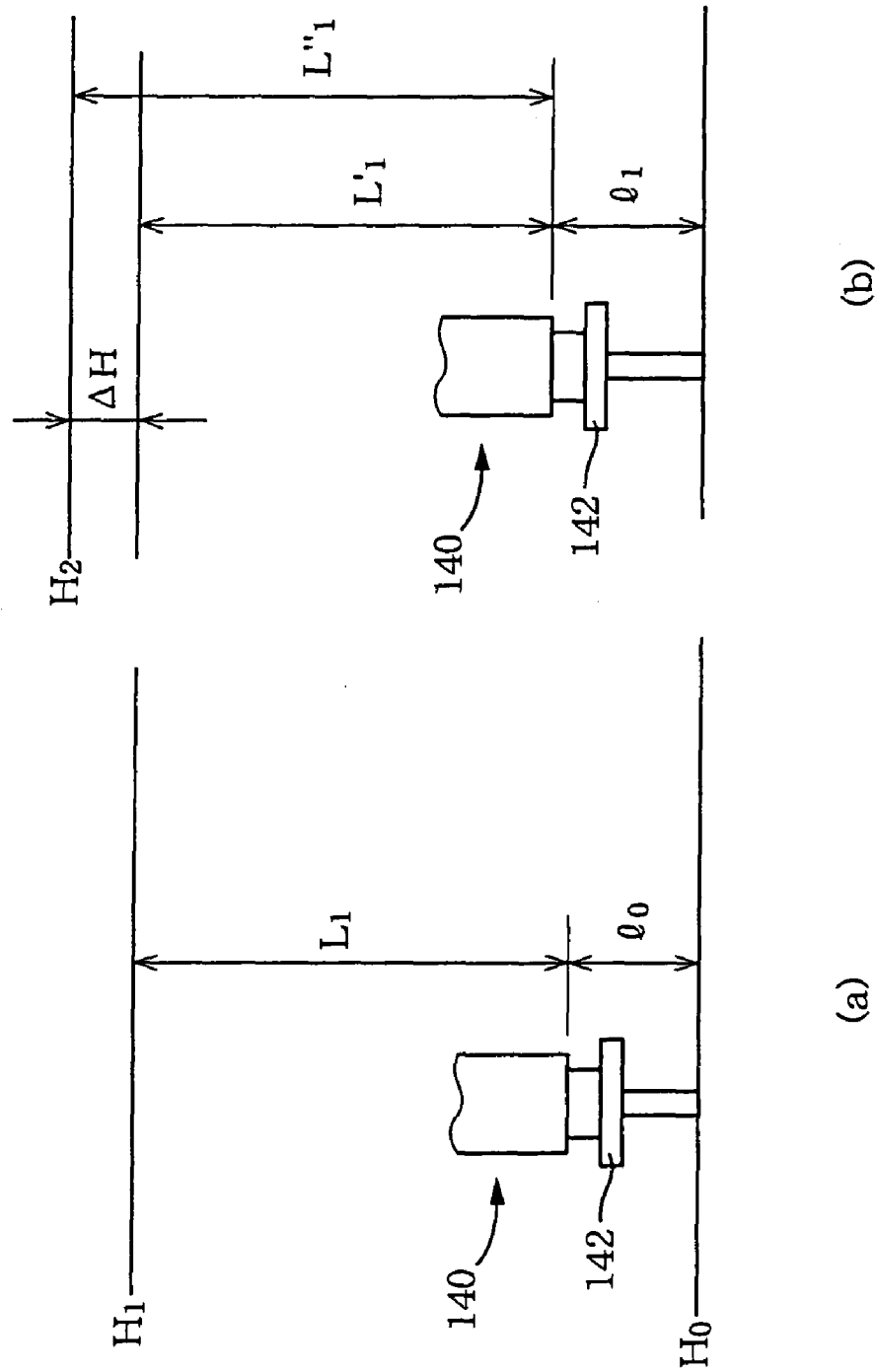
FIG. 15 is an illustrative view for explaining a method of calculating a height position of the mounting head attached.

Then, at Step S62, a head height position, i.e., a height position where the mounting head 21a is attached to the mounting module 12 is calculated. FIGS. 15(a) and 15(b) illustratively show a method of calculating the head height position. In the figure, symbol "$H_0$" indicates the above-described reference height position; and symbol "$H_1$" indicates a designed height position where the mounting head 21a is to be attached. As previously explained, the unit height position data corresponding to each of the mounting units 140 are stored in the RAM 416. The stored unit height position data represent, on an assumption that the mounting head 21a is attached at the designed attachment height position $H_1$ and a reference nozzle (having a length $l_0$ with respect to a portion thereof between the nozzle holding portion and the lower end of the nozzle) is attached to the head 21a, a stroke L of downward movement of the mounting unit 140 that is needed for the lower end of the reference nozzle to reach the reference height position $H_0$. FIG. 15(a) shows a downward-movement stroke $L_1$ corresponding to the reference unit. An actual length l of the suction nozzle 142 attached to each mounting unit 140 is already stored in the RAM 416, as described above. The suction nozzle 142 attached to the reference unit has a length $l_1$. If, as illustrated in FIG. 15(b), the mounting head 21a is attached at the designed attachment height position $H_1$, a downward-movement stroke $L_1'$ of the reference unit should be measured, as follows: $L_1'=L_1-(l_1-l_0)$. However, if a downward-movement stroke of the reference unit is actually measured as $L_1''$, it means that an actual attachment height position $H_2$ is deviated from the designed attachment height position $H_1$, as illustrated in FIG. 15(b). Thus, an error $\Delta H$ of attachment of the mounting head 21a is obtained, as follows: $\Delta H=H_2-H_1=L_1''-L_1'$. Thus, at Step S62, the head attachment height position is calculated by calculating the attachment error $\Delta H$, and the calculated attachment error $\Delta H$ is stored in a head-attachment-height-position storage portion of the RAM 416.

Subsequently, at Step S63, a height position of each of the mounting units 140 is adjusted. Based on the stored batches of unit height position data $L_1$ through $L_8$ corresponding to the eight mounting units 140 (the suffixed numbers 1 through 8 indicate the first through eighth mounting units 140, respectively; this applies to the following description), the respective lengths $l_1$ through $l_8$ of the respective suction nozzles 142 attached to the eight mounting units 140, and the calculated attachment error ΔH of the mounting head 21a, respective height positions of the mounting heads 140 are determined and commanded.

Figure 16:
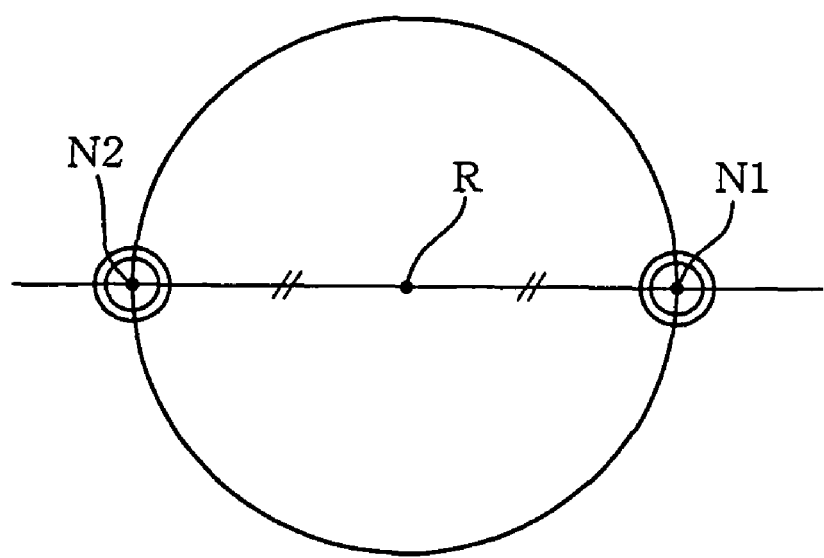
FIG. 16 is an illustrative view for explaining a method of determining a center of revolution of a mounting unit.

Subsequently, the control goes to Step S64 to determine, based on image data provided by the component camera 24, a center of rotation of each of the mounting units 140. The suction nozzle 142 attached to the each mounting unit 140 may not be coaxial with the center of rotation of the each mounting unit 140, because of, e.g., bending of the nozzle 142. FIG. 16 illustrates a method of determining a center, R, of rotation of each mounting unit 140, based on a position, N1, of the lower end of the suction nozzle 142 when the each mounting unit 140 takes a reference rotation position, and a position, N2, of the lower end of the suction nozzle 142 when the each mounting unit 140 is rotated by 180 degrees from the reference rotation position. The positions N1, N2 are determined based on the image data. More specifically described, the rotation center R is determined as a midpoint of a straight segment connecting between the positions N1, N2. At Step S64, first, all the mounting units 140 are positioned within the field of view of the component camera 24, by moving the mounting head 21a so that a designed center of indexing revolution of each of the mounting units 140 is positioned at a position on an optical axis line of the component camera 24. At that position, the mounting unit 140 being positioned at the unit elevating and lowering station is rotated to determine the rotation center R of the mounting unit 140 in the above-described method. In a state in which the mounting head 21a is kept stationary, the mounting units 140 are sequentially revolved for indexing, so as to determine a rotation center of each of the mounting heads 140. To this end, the respective height positions of respective lower ends of the respective suction nozzles 142 of the mounting units 140 are adjusted to be equal to the lowest height position of all those height positions and, in this state, respective images of the suction nozzles 142 are taken by the component camera 24. The component camera 24 is disposed such that the thus adjusted height positions of respective lower ends of the suction nozzles 142 are around the deepest position within a depth of field of the camera 24.

Figure 17:
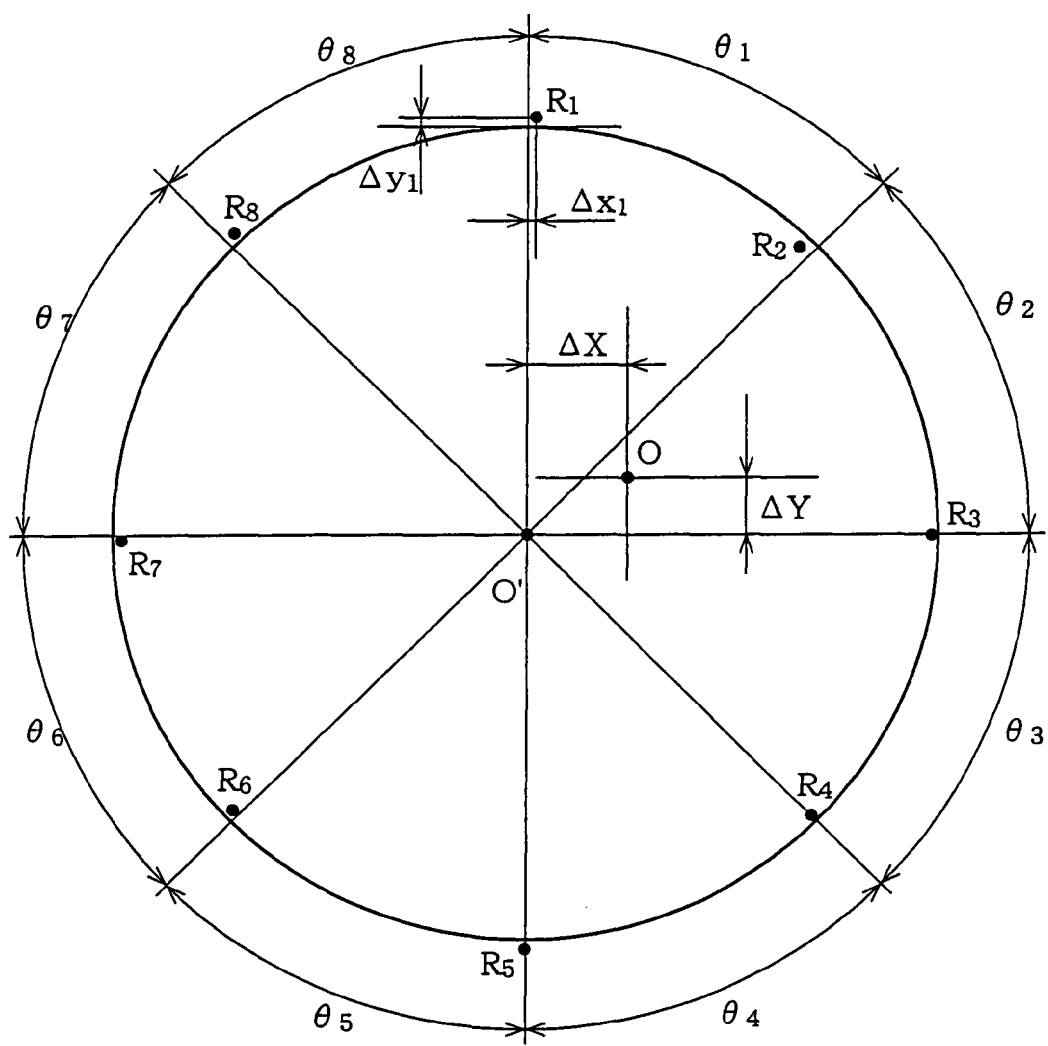
FIG. 17 is an illustrative view for explaining a method of calculating a center around which the mounting unit is revolved for indexing.

Then, at Step S65, a position of the attached mounting head 21a in a horizontal plane is calculated based on the respective measured rotation centers R of the mounting units 140, obtained at Step S64. More specifically described, a center of indexing revolution of each of the mounting units 140 is calculated. FIG. 17 illustrates a method of calculating a center about which each of the mounting units 140 is revolved for indexing. Since the unit-provision angle data $\theta_1$ through $\theta_8$ are stored as described above, it is possible to plot, on a plane, the measured rotation centers R, based on the stored unit-provision angle data $\theta_1$ through $\theta_8$. In FIG. 17, symbols $R_1$ through $R_8$ indicate the respective measured rotation centers of the mounting units 140, plotted on the plane. Based on the rotation centers $R_1$ through $R_8$, an actual center, O', of indexing revolution can be approximately calculated in a geometric manner. Next, the thus calculated indexing-revolution center O' is compared with a designed indexing-revolution center, O, when the mounting head 21a is attached at a designed position. In FIG. 17, the actual indexing-revolution center O' is deviated from the designed indexing-revolution center O, by an amount ΔX in the left-and-right direction and by an amount ΔY in the front-and-rear direction. Those deviation amounts, i.e., attachment errors (ΔX, ΔY) are stored in an indexing-revolution-center error storage portion of the RAM 416.

Once the actual indexing-revolution center O' is calculated, respective rotation centers of the mounting units 140 relative to the actual indexing-revolution center O' can be calculated, and accordingly respective deviations $(\Delta x_1, \Delta y_1)$ through $(\Delta x_8, \Delta y_8)$ of the respective measured or actual rotation centers of the mounting units 140 from the thus calculated rotation centers of the mounting units 140 can be obtained. Those deviations are also utilized in adjusting the positions to which the mounting head 21a is to be moved, as will be described later.

Then, at Step S66, the component camera 24 is used, like at Step S64, to take respective images of the suction nozzles 142 attached to the mounting units 140 and determine another or second rotation center of each of the same 140. At Step S66, the respective second rotation centers of the mounting units 140 are determined based on the image data obtained in a state in which the respective lower ends of the suction nozzles 142 are positioned at a different height position from the height position where the respective lower ends of the suction nozzles 142 are positioned to determine the respective first rotation centers of the mounting heads 140 at Step S64. More specifically described, at Step S64, the lower end of each suction nozzle 142 is positioned around the deepest position within the depth of field of the component camera 24, whereas at Step S66, the lower end of each suction nozzle 142 is positioned around the shallowest position within the depth of field of the component camera 24 that is lower than the deepest position. However, the second rotation centers of the mounting units 140 are determined in the same method as that employed at Step S64, and the description of the method is omitted. Thus, the first and second rotation centers of each of the mounting units 140 are obtained at the different height positions, and accordingly respective second deviations $(\Delta x_1', \Delta y_1')$ through $(\Delta x_8', \Delta y_8')$ of the respective actual rotation centers of the mounting units 140 are obtained in addition to the respective first deviations $(\Delta x_1, \Delta y_1)$ through $(\Delta x_8, \Delta y_8)$ of the respective actual rotation centers of the mounting units 140, obtained at Step S64.

Then, at Step S67, the positions to which the mounting head 21a is to be moved are adjusted based on the errors (ΔX, ΔY) of the indexing-revolution center of each of the mounting units 140 and the above-indicated first and second deviations (Δx, Δy), (Δx', Δy') (the suffixed numbers 1 through 8 are omitted) of the each mounting unit 140. More specifically described, the first and second deviations corresponding to the different height positions, respectively, are used to obtain a third deviation and thereby estimate an inclination of each mounting unit 140. Thus, even though each mounting unit 140 may be elevated or lowered to an arbitrary height position, a deviation of the rotation center of the each mounting unit 140 at that height position from a theoretical rotation center of the same 140 can be estimated in a geometric manner. Since the attachment errors (ΔX, ΔY) of the indexing-revolution center of each mounting unit 140 are additionally taken into account, the mounting head 21a can be moved to an accurate position corresponding to the particular height position of the each mounting unit 140, and accordingly it can accurately perform the mounting operation. The first and second deviations (Δx, Δy), (Δx', Δy') of each of the mounting units 140 are stored in a unit-deviation storage portion of the RAM 416 and, based on those deviations, positions to which the mounting head 21a are to be subsequently moved are determined and commanded.

<Functions of Module Control Device>

Figure 18:
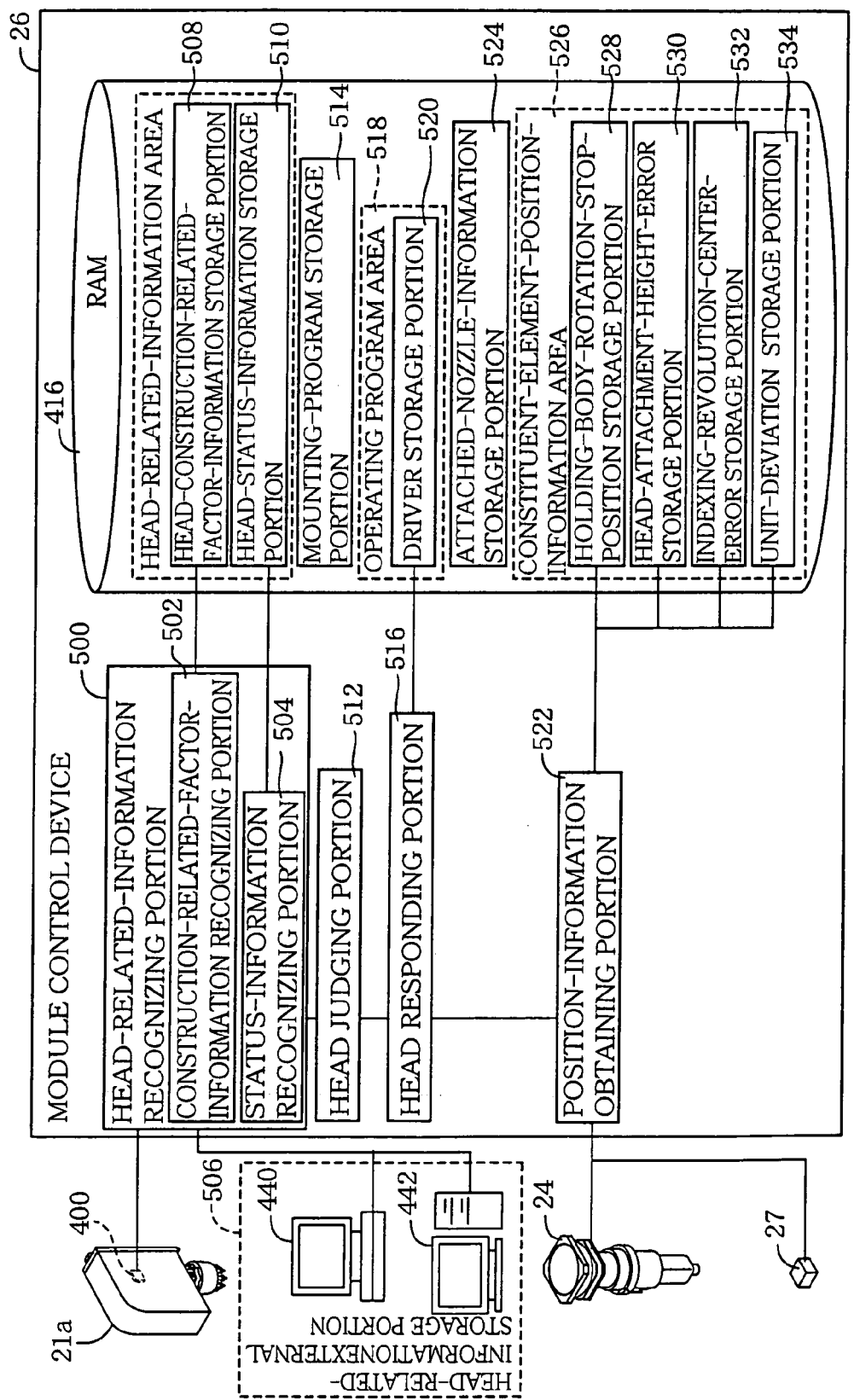
FIG. 18 is a diagrammatic view for explaining the control functions of the module control device that are related to the head-use preparing program.

In the present embodiment, the preparing steps related to the attachment of the operation performing head 21 are carried out by the module control device 26 according to the head-use preparing program, as previously described. Various functions of the module control device 26 that are involved in the preparing steps will be described below by reference to FIG. 18. Like the foregoing description, the following description will be made on an assumption that the mounting head 21a is attached.

The module control device 26 includes four main portions that are involved in the head-use preparing steps. The first one of the four main portions is a head-related-information recognizing portion 500 including a portion that carries out Step S1, i.e., the head-related-information recognizing step in which the head-related information is recognized based on the individual information of the mounting head 21a, i.e., the head-stored information that is stored by the memory chip 400 as the individual-information recording medium of the mounting head 21a. The head-related-information recognizing portion 500 includes a construction-related-factor-information recognizing portion 502 and a status-information recognizing portion 504. The construction-related-factor-information recognizing portion 502 recognizes the head-construction-related-factor information including the head type data, the unit provision angle data, and the unit height position data, and carries out Steps S12, S14, etc. The status-information recognizing portion 504 recognizes the head-status information including the after-maintenance operation time data, the predetermined-time-duration failure rate data, and the module-related predetermined-time-duration failure rate data, and carries out Steps S12, S13, S15, etc. The head-related information is recognized in such a manner that necessary information is obtained, using the head ID data as a key, from the module-device management computer 440 and the production-history management computer 442 each of which functions as a head-related-information external storage portion 506. That is, that the necessary information is obtained means that the head-related information is recognized. The RAM 416 includes, in a head-related-information area thereof, a head-construction-related-factor-information storage portion 508 and a head-status-information storage portion 510 each of which corresponds to the head-related-information recognizing portion 500.

The module control device 26 includes, as the second one of the four main portions thereof, a head judging portion 512. The head judging portion 512 is for judging whether the mounting head 21a attached is appropriate for use, and carries out Step S2. Based on the head-related information recognized by the head-related-information recognizing portion 500, the head judging portion 512 judges whether the use of the mounting head 21a is appropriate. The head judging portion 512 is divided into two portions one of which makes a judgment based on the head type data as the head-construction-related-factor information, and the contents of the mounting program stored by a mounting-program storage portion 514 of the RAM 416, and the other of which makes respective judgments based on the after-maintenance operation time data, the predetermined-time-duration failure rate data, and the module-related predetermined-time-duration failure rate data, each as the head-status information.

The module control device 26 includes, as the third one of the four main portions thereof, a head responding portion 516. In short, the head responding portion 516 is for carrying out a preparing step to enable a control of the mounting head 21a attached. This preparing step is carried out by storing the operation-performing-head driver corresponding to the mounting head 21a, in a driver storage portion 520 provided in an operating program area 518 of the RAM 416. The head responding portion 516 carries out Step S3, etc.

The module control device 26 includes, as the fourth one of the four main portions thereof, a position-information obtaining portion 522 that is for obtaining, based on the recognized head-construction-related-factor information, the constituent-element-position information as the position information related to the operative movement of each of the constituent elements of the mounting head 21a, and carrying out so-called "calibrations", i.e., Steps S4, S6, etc. in the above-described head-use preparing steps. Based on the information stored by an attached-nozzle-information storage portion 524 of the RAM 416, e.g., the nozzle length data related to the suction nozzles 142 attached, the previously recognized unit provision angle data and unit height position data, etc., the constituent-element-position information is obtained. To this end, the measurement results, such as the images taken by the component camera 24 or the height positions detected by the nozzle-end-height detector 27, are used, as needed. In the head-use preparing steps, the following data are obtained as the constituent-element-position information: the rotation stop positions of the unit holding body 294 for the indexing revolution of each of the mounting units 140; the error $\Delta H$ of the attachment height position of the mounting head 21a; the errors ($\Delta X$, $\Delta Y$) of the indexing-revolution center; and the deviations ($\Delta x$, $\Delta y$) of each of the mounting units 140. The thus obtained rotation stop positions, error $\Delta H$, errors ($\Delta X$, $\Delta Y$), and deviations ($\Delta x$, $\Delta y$) are stored in a holding-body-rotation-stop-position storage portion 528, a head-attachment-height-error storage portion 530, an indexing-revolution-center-error storage portion 532, and a unit-deviation storage portion 534, respectively, and are utilized in controlling the operation of the mounting head 21a.

The invention claimed is:

1. A component mounting apparatus comprising:
a substrate holding device which fixes and holds a circuit substrate;
a component supplying device which supplies a plurality of circuit components;
a head support portion;
a mounting head which is detachably attached to the head support portion and which, in a state in which the mounting head is attached to the head support portion, is operated to take each of the circuit components supplied by the component supplying device, and mount said each circuit component on a surface of the circuit substrate fixed and held by the substrate holding device, wherein the mounting head has a rear portion that has an upper half and a lower half, wherein the lower half has a lower portion that is positioned to the lower half-side of a middle line that divides the upper half and the lower half, and wherein the mounting head has, in the lower portion thereof, at least one leg portion, and the head support portion has at least one leg support portion configured to support a lower end of said at least one leg portion of the mounting head from a lower side of said at least one leg portion; and
a forcing means comprising an elastic member which is supported by the head support portion and which forces, owing to an elastic force thereof, the rear portion of the mounting head rearward toward a front portion of the head support portion, and additionally forces, owing to the elastic force thereof, said at least one leg portion of the mounting head downward toward said at least one leg support portion of the head support portion, so as to attach the mounting head to the head support portion.

2. The component mounting apparatus according to claim 1, wherein an arbitrarily selected one of a plurality of said mounting heads is attachable to the head support portion.

3. The component mounting apparatus according to claim 2, wherein the mounting heads have respective different constructions, and an arbitrarily selected one of the mounting heads having the respective different constructions is attachable to the head support portion.

4. The component mounting apparatus according to claim 1, further comprising a head moving device which includes an X-direction moving device that has the head support portion to which the mounting head is attached, and moves the head support portion in an X direction along a straight line; and a Y-direction moving device which moves the X-direction moving device in a Y direction perpendicular to the X direction, and wherein the head moving device moves the mounting head on a plane parallel to the circuit substrate fixed and held by the substrate holding device.

5. The component mounting apparatus according to claim 4, wherein in the state in which the mounting head is attached to the head support portion, a length of a combination of the mounting head and the head support portion, in the X direction, is not more than 60 mm.

6. The component mounting apparatus according to claim 4, wherein a weight of the combination of the mounting head and the head support portion is not more than 5 kg.

7. The component mounting apparatus according to claim 4, further comprising an image taking device which takes an image of a fiducial mark affixed to the surface of the circuit substrate and which is supported by the head support portion such that the image taking device is located at a position that is aligned, in the Y direction, with the mounting head attached to the head support portion.

8. The component mounting apparatus according to claim 4, wherein the mounting head has two said leg portions and an engaging block, wherein the head support portion has two said leg support portions for supporting the two leg portions of the mounting head, respectively; an engaging hole that receives the engaging block of the mounting head; and a head fixing device that engages a portion of the engaging block and thereby fixes the engaging block to the head support portion, and wherein the forcing means comprises the engaging block of the mounting head and the head fixing device of the head support portion.

9. The component mounting apparatus according to claim 8, wherein the two leg portions of the mounting head have respective wedge-like free ends, and the two leg support portions of the head support portion have respective V-shaped grooves in which the respective wedge-like free ends of the two leg portions fit, so that a position of the mounting head in a vertical direction is defined.

10. The component mounting apparatus according to claim 8, wherein the head support portion further has two first engaging rollers, and two second engaging rollers are provided in the engaging hole of the head support portion, and wherein two opposite inner surfaces of the two leg portions of the mounting head closely engage respective outer circumferential surfaces of the two first engaging rollers, and two side surfaces of the engaging block of the mounting head closely fit in a space between respective outer circumferential surfaces of the two second engaging rollers, so that a position of the mounting head in a left-and-right direction is defined.

11. The component mounting apparatus according to claim 1, wherein the forcing means comprises a head fixing device which includes a grip that is gripped by a hand of an operator and which fixes, upon operation of the grip, the mounting head to the head support portion while forcing the mounting head rearward against the front portion of the head support portion, and forcing said at least one leg portion of the mounting head downward against said at least one leg support portion of the head support portion.

12. The component mounting apparatus according to claim 11, further comprising a positioning means for positioning the mounting head relative to the head support portion with respect to each of a vertical direction and a left-and-right direction, wherein the positioning means comprises said at least one leg portion of the mounting head and said at least one leg support portion of the head support portion that cooperate with each other to position the mounting head relative to the head support portion with respect to the vertical direction.

13. The component mounting apparatus according to claim 11, wherein the mounting head comprises:
a main body which is fixed to the head support portion by the head fixing device; and
at least one mounting unit which includes a component holding device that holds one of the circuit components supplied by the component supplying device, and which is supported by the main body such that the component holding device is movable upward and downward.

14. The component mounting apparatus according to claim 1, wherein the mounting head which is detachably attached to the head support portion includes a plurality of component suction nozzles.

15. The component mounting apparatus according to claim 1, wherein the mounting head includes an element support portion; and at least one constituent element which is detachably attached to the element support portion.

16. The component mounting apparatus according to claim 15, wherein the mounting head includes a plurality of said constituent elements each of which is detachably attached to the element support portion.

17. The component mounting apparatus according to claim 16, wherein the plurality of constituent elements comprise a plurality of component suction nozzles each of which is detachably attached to the element support portion.

18. The component mounting apparatus according to claim 1, wherein the mounting head is attached to, and detached from, the head support portion by operating a permanent member which is permanently attached to the head support portion, and the forcing means comprises the permanent member permanently attached to the head support portion.

19. The component mounting apparatus according to claim 1, further comprising a left-and-right-direction positioning means for positioning the mounting head relative to the head support portion with respect to a left-and-right direction, wherein a portion of the left-and-right direction positioning means is provided on the front portion of the head support portion.

20. The component mounting apparatus according to claim 1, wherein the front portion of the head support portion has a vertical front surface extending in a vertical direction, wherein the rear portion of the mounting head has a vertical rear surface extending in the vertical direction, and wherein in the state in which the mounting head is attached to the head support portion, the elastic member presses the mounting head rearward toward the head support portion, such that the vertical rear surface of the mounting head is held in pressed contact with the vertical front surface of the head support portion.

21. The component mounting apparatus according to claim 20, wherein said at least one leg support portion of the head support portion extends substantially perpendicularly from the vertical front surface of the front portion of the head support portion.

22. The component mounting apparatus according to claim 20, wherein said at least one leg support portion of the head support portion has an inclined surface facing toward the vertical front surface of the front portion of the head support portion.

23. The component mounting apparatus according to claim 20, wherein the mounting head comprises:
at least one mounting unit which, in a state in which the mounting head is attached to the head support portion, is operated to take said each circuit component supplied by the component supplying device, and mount said each circuit component on the surface of the circuit substrate fixed and held by the substrate holding device; and
at least one of (a) a first drive source which elevates and lowers said at least one mounting unit and (b) a second drive source which rotates said at least one mounting unit about an axis line thereof.

24. The component mounting apparatus according to claim 1, wherein:
the forcing means comprises a rotatable member which is permanently attached to the head support portion and which is rotatable in each of opposite directions,
when the rotatable member is rotated in one of the opposite directions, the mounting head is pressed rearward against the front portion of the head support portion, and said at least one leg portion of the mounting head is pressed downward against said at least one leg support portion of the head support portion, so as to lock the mounting head to the head support portion, and
when the rotatable member is rotated in an other of the opposite directions, the mounting head is unlocked from the head support portion.

25. The component mounting apparatus according to claim 1, wherein:
said at least one leg portion of the mounting head has a wedge-like free end configured to fit in two said leg support portions of the head support portion,
the head support portion further has two first engaging rollers and two second engaging rollers,
the mounting head further has a space which is defined by, and between, respective inner surfaces of the mounting head and which is configured to receive the two first engaging rollers of the head support portion such that said respective inner surfaces of the mounting head engage respective outer circumferential surfaces of the two first engaging rollers, and
the mounting head further has, in an upper portion thereof, an engaging block which supports a third engaging roller as a portion of the forcing means and which has two side surfaces configured to engage respective outer circumferential surfaces of the two second engaging rollers of the head support portion.

26. The component mounting apparatus according to claim 1, wherein the mounting head comprises:
at least one mounting unit which, in a state in which the mounting head is attached to the head support portion, is operated to take said each circuit component supplied by the component supplying device, and mount said each circuit component on the surface of the circuit substrate fixed and held by the substrate holding device; and
at least one of (a) a first drive source which elevates and lowers said at least one mounting unit and (b) a second drive source which rotates said at least one mounting unit about an axis line thereof.

27. A component mounting system, comprising:
(A) a component mounting apparatus including:
a substrate holding device which fixes and holds a circuit substrate,
a component supplying device which supplies a plurality of circuit components,
a head support portion,
a mounting head which is detachably attached to the head support portion and which, in a state in which the mounting head is attached to the head support portion, is operated to take each of the circuit components supplied by the component supplying device, and mount said each circuit component on a surface of the circuit substrate fixed and held by the substrate holding device, wherein the mounting head has a rear portion that has an upper half and a lower half, wherein the lower half has a lower portion that is positioned to the lower half-side of a middle line that divides the upper half and the lower half, and wherein the mounting head has, in the lower portion thereof, at least one leg portion, and the head support portion has at least one leg support portion configured to support a lower end of said at least one leg portion of the mounting head from a lower side of said at least one leg portion; and
a forcing means comprising an elastic member which is supported by the head support portion and which forces, owing to an elastic force thereof, the rear portion of the mounting head rearward toward a front portion of the head support portion, and additionally forces, owing to the elastic force thereof, said at least one leg portion of the mounting head downward toward said at least one leg support portion of the head support portion, so as to attach the mounting head to the head support portion,
wherein the mounting head comprises a recording medium in which individual information related to the mounting head is recorded;
(B) an external storage portion which stores, outside the component mounting apparatus, a plurality of batches of head-related information that are respectively related to a plurality of said mounting heads; and
(C) a recognizing portion which obtains and recognizes, based on the individual information, the batch of head-related information corresponding to the mounting head attached to the head support portion, from the external storage portion.

28. The component mounting system according to claim 27, wherein the mounting head includes a nozzle support portion; and a plurality of component suction nozzles each of which is detachably attached to the nozzle support portion.

* * * * *